(12) United States Patent
Kong et al.

(10) Patent No.: US 12,362,010 B2
(45) Date of Patent: Jul. 15, 2025

(54) MEMORY CIRCUIT AND METHOD OF OPERATING SAME

(71) Applicants: TAIWAN SEMICONDUCTOR MANUFACTURING COMPANY, LTD, Hsinchu (TW); TSMC NANJING COMPANY, LIMITED, Nanjing (CN)

(72) Inventors: Luping Kong, Hsinchu (TW); Chia-Cheng Chen, Hisnchu (TW); Ching-Wei Wu, Hsinchu (TW); Jun Xie, Hsinchu (TW)

(73) Assignees: TAIWAN SEMICONDUCTOR MANUFACTURING COMPANY, LTD, Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 93 days.

(21) Appl. No.: 18/359,169

(22) Filed: Jul. 26, 2023

(65) Prior Publication Data

US 2025/0006255 A1  Jan. 2, 2025

(30) Foreign Application Priority Data

Jun. 29, 2023  (CN) .......................... 202310782406.9

(51) Int. Cl.
  *G11C 11/00* (2006.01)
  *G11C 11/418* (2006.01)
(52) U.S. Cl.
  CPC .................. *G11C 11/418* (2013.01)

(58) Field of Classification Search
  CPC ......... G11C 7/22; G11C 7/222; G11C 7/1093; G11C 11/419; G11C 11/417; G11C 2207/2254; G11C 7/1009; G11C 7/1012; G11C 7/1087; G11C 7/20; G11C 11/413; G11C 11/4076; G11C 7/1066;
  (Continued)

(56) References Cited

U.S. PATENT DOCUMENTS 7,577,056 B2  8/2009  Hsu
7,622,968 B2  11/2009  Liu
(Continued)

FOREIGN PATENT DOCUMENTS

KR  10-2011-0081978  7/2011
KR  10-2019-0032638  3/2019
(Continued)

*Primary Examiner* — Thong Q Le
(74) *Attorney, Agent, or Firm* — Hauptman Ham, LLP

(57) ABSTRACT

A memory circuit includes a control circuit coupled to the word line driver circuit. The control circuit is configured to delay a leading or falling edge of a word line signal in response to at least a first clock signal. The control circuit includes a first clock circuit configured to generate a second clock signal in response to a first reset signal and a clock signal, and an adjustable delay circuit configured to adjust a delay between the second and third clock signal in response to the second clock signal and an enable signal. The third clock signal is a delayed version of the second clock signal. An amount of the delay between the second and third clock signal is based on a voltage difference between a first supply voltage having a first swing, and a second supply voltage having a second swing.

20 Claims, 13 Drawing Sheets

(58) Field of Classification Search
CPC ....... G11C 7/1072; G11C 8/18; G11C 11/418; G11C 8/08; G11C 8/10; H03L 7/07; H03L 7/0812; H03L 7/0814; H03L 7/0816; H03L 7/0818; H03L 7/0891
See application file for complete search history.

(56) References Cited

U.S. PATENT DOCUMENTS 9,508,417 B2 * 11/2016 Kwak .................... G11C 7/222
11,087,806 B2    8/2021 Miyano et al.

FOREIGN PATENT DOCUMENTS

KR    10-2022-0050054    4/2022
TW    I751666    1/2022

* cited by examiner

MEMORY CIRCUIT AND METHOD OF OPERATING SAME

PRIORITY CLAIM

This application claims the priority of China Application No. 202310782406.9, filed Jun. 29, 2023, which is incorporated herein by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices is also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
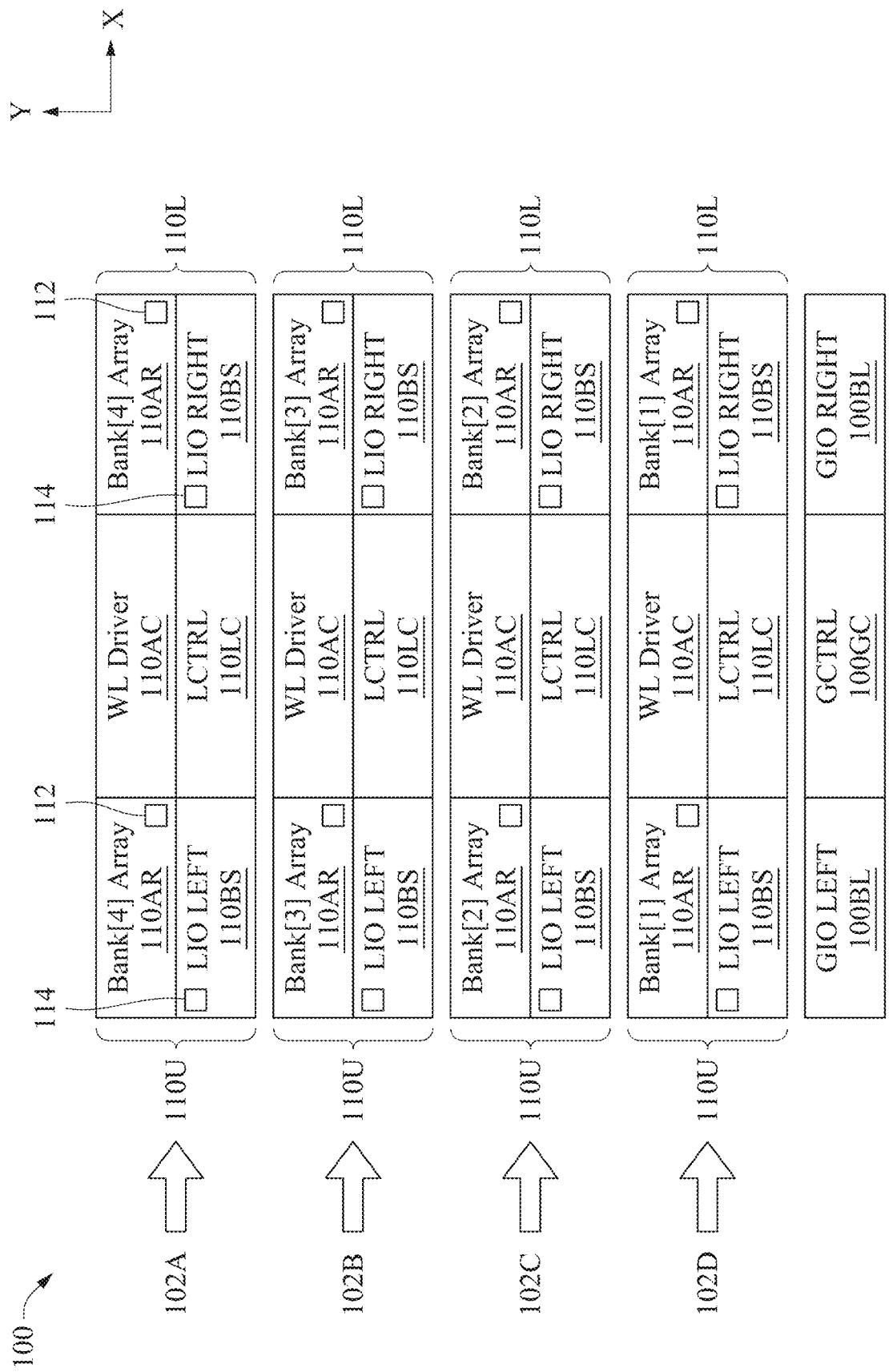
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a word line driver circuit coupled to a word line, and a control circuit coupled to the word line driver circuit.

In some embodiments, the control circuit is configured to delay a leading edge or a falling edge of a word line signal in response to at least a first clock signal.

In some embodiments, the control circuit includes a first clock circuit configured to generate a second clock signal in response to a first reset signal and a clock signal.

In some embodiments, the control circuit further includes an adjustable delay circuit configured to adjust a delay between the second clock signal and a third clock signal in response to the second clock signal and an enable signal. In some embodiments, the third clock signal is a delayed version of the second clock signal.

In some embodiments, by the memory circuit including the adjustable delay circuit, the third clock signal is delayed with respect to the second clock signal. In some embodiments, by delaying the third clock signal, a word line clock signal is also delayed without reducing a pulse width of the word line clock signal, thereby resulting in a more flexible memory design than other approaches.

In some embodiments, an amount of the delay between the second clock signal and the third clock signal is based on a voltage difference between a first supply voltage and a second supply voltage. In some embodiments, the first supply voltage has a first swing. In some embodiments, the second supply voltage has a second swing.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the embodiment depicted in FIG. 1, memory circuit 100 includes a total of four partitions. In some embodiments, memory circuit 100 includes a total number of partitions greater or fewer than four.

GIO circuit 100BL is a circuit configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (not shown).

Global control circuit 100GC is a circuit configured to control some or all of program and read operations on each memory partition 102A-102D, e.g., by generating and/or outputting one or more control and/or enable signals.

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decoder or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110LC includes a bank decoder circuit.

Each LIO circuit 110BS is configured to selectively access one or more bit lines (shown in FIG. 2) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each LIO circuit 110BS includes one or more circuits 114. For ease of illustration, circuit 114 is not shown in memory bank 110U and 110L of memory partitions 102B, 102C and 102D. In some embodiments, each circuit 114 includes at least a sense amplifier circuit or a write-in latch circuit. During a write operation, the write-in latch circuit is configured to write data into at least one memory cell 112 in a corresponding column of memory cells in the corresponding memory cell array 110AR, in accordance with some embodiments. During a read operation, the sense amplifier circuit is configured to read data from at least one memory cell 112 in a corresponding column of memory cells in the corresponding memory cell array 110AR, in accordance with some embodiments. In some embodiments, each circuit 114 in LIO circuit 110BS is coupled to a corresponding column of memory devices 112 in memory cell array 110AR.

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (not shown). In some embodiments, each column of memory devices 112 in memory cell array 110AR is coupled to a corresponding circuit 114 in LIO circuit 110BS.

Memory device 112 is shown in memory bank 110U and 110L of memory partition 102A. For ease of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more single port (SP) static random access memory (SRAM) cells. In some embodiments, memory device 112 includes one or more dual port (DP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

Figure 2:
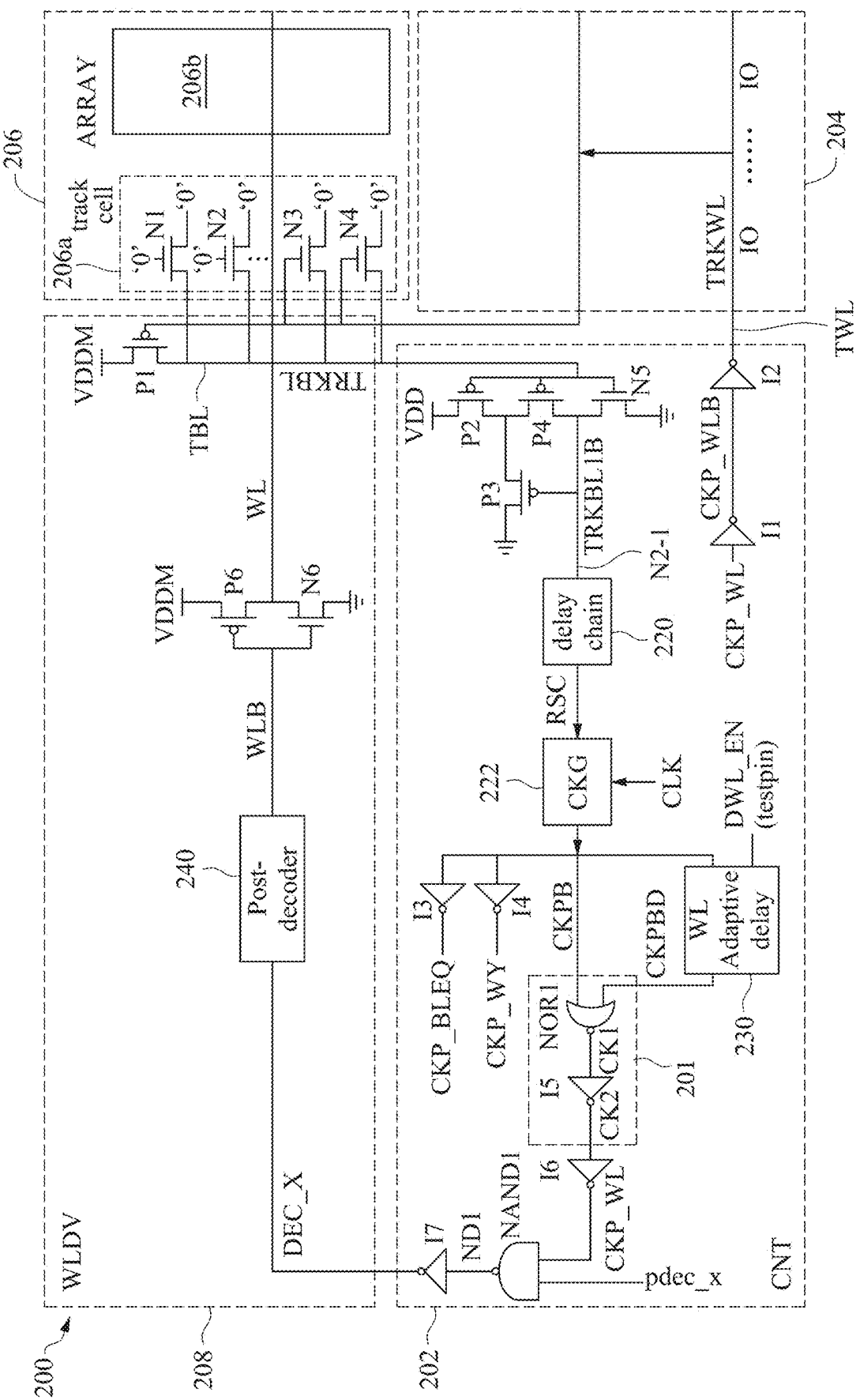
FIG. 2 is a circuit diagram of a memory circuit, in accordance with some embodiments.

FIG. 2 is a circuit diagram of a memory circuit 200, in accordance with some embodiments.

Memory circuit 200 is an embodiment of a portion of at least one of memory partition 102A, 102B, 102C or 102D of FIG. 1, and similar detailed description is therefore omitted. For example, memory circuit 200 is an embodiment of local control circuit 110LC of FIG. 1, memory cell array 110AR of FIG. 1, LIO circuit 110BS of FIG. 1, and the WL driver circuit 110AC of FIG. 1, and similar detailed description is therefore omitted.

In some embodiments, memory circuit 200 illustrates a non-limiting example where a control circuit 202 is an embodiment of local control circuit 110LC of FIG. 1, a memory cell array 206 is an embodiment of memory cell array 110AR of FIG. 1, WL driver circuit 208 is an embodiment of the WL driver circuit 110AC of FIG. 1, and IO circuit 204 is LIO circuit 110BS of FIG. 1, and similar detailed description is therefore omitted.

Memory circuit 200 includes a control circuit 202 coupled to an IO circuit 204, a memory cell array 206 and a WL driver circuit 208. Control circuit 202 is coupled to IO circuit 204 by at least a tracking word line TWL. Control circuit 202 is further coupled to memory cell array 206 by at least a tracking bit line TBL. Control circuit 202 is further coupled to WL driver circuit 208 by at least a decoder line (not labelled).

Control circuit 202 is configured to control the WL driver circuit 208 by a decoder signal DEC_X. Control circuit 202 is configured to generate the decoder signal DEC_X in response to at least one of a tracking bit line signal TRKBL, a clock signal CLK, an enable signal DWL_EN or a clock signal CKP_WL. Control circuit 202 is further configured to generate the tracking word line signal TRKWL in response to the clock signal CKP_WL.

Control circuit 202 includes an inverter I1 and an inverter I2.

Inverter I1 is configured to generate an inverted clock signal CKP_WLB in response to the clock signal CKP_WL. In some embodiments, the clock signal CKP_WL is inverted from the inverted clock signal CKP_WLB. In some embodiments, the clock signal CKP_WL is useable to generate the word line signal WL. An input terminal of inverter I1 is configured to receive the clock signal CKP_WL. The input terminal of inverter I1 is coupled to an output terminal of inverter I6. For ease of illustration, the input terminal of inverter I1 is not shown as being coupled to the output terminal of inverter I6. An output terminal of inverter I1 is coupled to an input terminal of inverter I2, and is configured to output the inverted clock signal CKP_WLB.

Inverter I2 is configured to generate the tracking word line signal TRKWL in response to the inverted clock signal CKP_WLB. In some embodiments, the tracking word line signal TRKWL is inverted from the inverted clock signal CKP_WLB. An input terminal of inverter I2 is coupled to the output terminal of inverter I1, and is configured to receive the inverted clock signal CKP_WLB. An output terminal of inverter I2 is coupled to the tracking word line TWL and the IO circuit 204. In some embodiments, the output terminal of inverter I2 is further coupled to the memory cell array 206 and the WL driver circuit 208 by at least the tracking word line TWL. The output terminal of inverter I2 is configured to output the tracking word line signal TRKWL.

Control circuit 202 further includes P-type metal oxide semiconductor (PMOS) transistors P2, P3 and P4, and N-type metal oxide semiconductor (NMOS) transistor N5.

In some embodiments, at least one of PMOS transistor P2, PMOS transistor P3, PMOS transistor P4 or NMOS transistor N5 is configured to set a signal TRKBL1B in response to the tracking bit line signal TRKBL.

A source of PMOS transistor P2 is coupled to a first voltage supply having a supply voltage VDD. Each of a gate of PMOS transistor P2, a gate of PMOS transistor P4 and a gate of NMOS transistor N5 are coupled together and configured to receive the tracking bit line signal TRKBL on the tracking bit line TBL. Each of the gate of PMOS transistor P2, the gate of PMOS transistor P4 and the gate of NMOS transistor N5 are coupled to the tracking bit line TBL. Each of the gate of PMOS transistor P2, the gate of PMOS transistor P4 and the gate of NMOS transistor N5 are coupled to at least one of a drain of PMOS transistor P1, a drain/source of NMOS transistor N1, a drain/source of NMOS transistor N2, a drain/source of NMOS transistor N3 or a drain/source of NMOS transistor N4 by the tracking bit line TBL.

Each of a drain of PMOS transistor P2, a source of PMOS transistor P4 and a drain/source of PMOS transistor P3 are coupled together.

Each of a drain of PMOS transistor P4, a drain of NMOS transistor N5 and a gate of PMOS transistor P3 are coupled together and are further coupled to an input terminal of a delay chain circuit 220.

At least one of the drain of PMOS transistor P4 or the drain of NMOS transistor N5 is configured to output the signal TRKBL1B to the input terminal of the delay chain circuit 220. In some embodiments, at least one of the drain of PMOS transistor P4 or the drain of NMOS transistor N5 is configured to set the signal TRKBL1B.

A source of NMOS transistor N5 is coupled to a reference voltage supply VSS. A source/drain of PMOS transistor P3 is coupled to the reference voltage supply VSS.

Control circuit 202 further includes the delay chain circuit 220.

Delay chain circuit 220 is configured to generate a signal RSC in response to the signal TRKBL1B. In some embodiments, the signal RSC is a delayed version of the signal TRKBL1B. In some embodiments, the delay chain circuit 220 includes a delay chain circuit, such as delay chain circuit 602 (described below) of FIG. 6. In some embodiments, signal RSC is a reset signal useable to reset the clock generating circuit 222.

An input terminal of the delay chain circuit 220 is configured to receive the signal TRKBL1B. The input terminal of the delay chain circuit 220 is coupled to the drain of PMOS transistor P4, the drain of NMOS transistor N5 and the gate of PMOS transistor P3.

An output terminal of the delay chain circuit 220 is configured to output the signal RSC. The output terminal of the delay chain circuit 220 is coupled to a first input terminal of a clock generating circuit 222.

Control circuit 202 further includes the clock generating circuit 222 coupled to an inverter I3, an inverter I4, a NOR logic gate NOR1 and a WL adaptive delay circuit 230.

Clock generating circuit 222 is configured to generate a clock signal CKPB in response to the signal RSC and a clock signal CLK. Clock signal CKPB is a generated clock signal useable by control circuit 202 to generate the decoder signal DEC_X. The clock signal CLK is an internal clock signal of integrated circuit 200.

The first input terminal of the clock generating circuit 222 is configured to receive the signal RSC. A second input terminal of the clock generating circuit 222 is configured to receive the clock signal CLK.

The first input terminal of the clock generating circuit 222 is coupled to the output terminal of the delay chain circuit 220. The second input terminal of the clock generating circuit 222 is coupled to a source (not shown) of the clock signal CLK.

An output terminal of the clock generating circuit 222 is configured to output the clock signal CKPB. The output terminal of the clock generating circuit 222 is coupled to at least one of an input terminal of an inverter I3, an input terminal of an inverter I4, a first input terminal of a NOR logic gate NOR1, or a first input terminal of a WL adaptive delay circuit 230.

Inverter I3 is configured to generate a clock equalization signal CKP_BLEQ in response to the clock signal CKPB. In some embodiments, the clock equalization signal CKP_BLEQ is inverted from the clock signal CKPB. An input terminal of inverter I3 is configured to receive the clock signal CKPB. The input terminal of inverter I3 is coupled to the output terminal of clock generating circuit 222. An output terminal of inverter I3 is configured to output the clock equalization signal CKP_BLEQ. In some embodiments, the output terminal of inverter I3 is coupled to one or more other components (not shown). In some embodiments, the output terminal of inverter I3 is coupled to one or more equalization circuits (not shown).

Inverter I4 is configured to generate a clock signal CKP_WY in response to the clock signal CKPB. In some embodiments, the clock signal CKP_WY is inverted from the clock signal CKPB. An input terminal of inverter I4 is configured to receive the clock signal CKPB. The input terminal of inverter I4 is coupled to the output terminal of clock generating circuit 222. An output terminal of inverter I4 is configured to output the clock signal CKP_WY. In some embodiments, the output terminal of inverter I4 is coupled to one or more other components (not shown). In some embodiments, the output terminal of inverter I4 is coupled to one or more Y-decoder circuits (not shown).

The WL adaptive delay circuit 230 is configured to generate a clock signal CKPBD in response to the clock signal CKPB and an enable signal DWL_EN. In some embodiments, the clock signal CKPBD is a delayed version of the clock signal CKPB. In some embodiments, an amount of delay in the clock signal CKPBD with respect to the clock signal CKPB can be adjusted by at least one of WL adaptive delay circuit 230 or circuit 500 as discussed in FIGS. 5-6.

The first input terminal of the WL adaptive delay circuit 230 is configured to receive the clock signal CKPB. The first input terminal of the WL adaptive delay circuit 230 is coupled to the output terminal of the clock generating circuit 222.

A second input terminal of the WL adaptive delay circuit 230 is configured to receive the enable signal DWL_EN. The second input terminal of the WL adaptive delay circuit 230 is coupled to a source (not shown) of the enable signal DWL_EN.

An output terminal of the WL adaptive delay circuit 230 is configured to output the clock signal CKPBD. The output terminal of the WL adaptive delay circuit 230 is coupled to a second input terminal of the NOR logic gate NOR1.

The second input terminal of the WL adaptive delay circuit 230 is a test-pin and is used to enable or disable the WL adaptive delay circuit 230. The WL adaptive delay circuit 230 is enabled or disabled in response to a value of the enable signal DWL_EN. For example, in some embodiments, the WL adaptive delay circuit 230 is enabled in response to the enable signal DWL_EN being a logic 1, and the WL adaptive delay circuit 230 is disabled in response to the enable signal DWL_EN being a logic 0. In some embodiments, the WL adaptive delay circuit 230 is enabled in response to the enable signal DWL_EN being a logic 0, and the WL adaptive delay circuit 230 is disabled in response to the enable signal DWL_EN being a logic 1.

If the WL adaptive delay circuit 230 is enabled, then the WL adaptive delay circuit 230 is configured to delay the clock signal CKPBD in comparison with the clock signal CKPB. In some embodiments, if the WL adaptive delay circuit 230 is enabled, then the WL adaptive delay circuit 230 is configured to delay at least one of the falling edge of the clock signal CKPBD or the rising edge of the clock signal CKPBD in comparison with the clock signal CKPB. In some embodiments, if the WL adaptive delay circuit 230 is enabled, then the WL adaptive delay circuit 230 is configured to delay at least one of a rising edge of a clock signal CLK_WL or a falling edge of the clock signal CLK_WL.

In some embodiments, if the WL adaptive delay circuit 230 is disabled, then the clock signal CKPBD is not a delayed version of the clock signal CKPB, and the clock signal CKPBD is set as a logic 0 by the WL adaptive delay circuit 230. Other values for the clock signal CKPB when the WL adaptive delay circuit 230 is disabled are within the scope of the present disclosure. In some embodiments, if the WL adaptive delay circuit 230 is disabled, then the WL adaptive delay circuit 230 is configured to not delay at least one of the rising edge of the clock signal CLK_WL or the falling edge of a clock signal CLK_WL, and the clock signal CLK_WL is an inverted version of the clock signal CKPB.

The first input terminal of NOR logic gate NOR1 is configured to receive clock signal CKPB. The first input terminal of NOR logic gate NOR1 is coupled to the output terminal of the clock generating circuit 222.

A second input terminal of NOR logic gate NOR1 is configured to receive the clock signal CKPBD. The second input terminal of NOR logic gate NOR1 is coupled to the output terminal of the WL adaptive delay circuit 230.

An output terminal of NOR logic gate NOR1 is configured to output the clock signal CK1. NOR logic gate NOR1 is configured to generate the clock signal CK1 based on the clock signal CKPB and the clock signal CKPBD. An output terminal of NOR logic gate NOR1 is coupled to an input terminal of an inverter I5.

Control circuit 202 further includes an inverter I5 and an inverter I6.

Inverter I5 is configured to generate a clock signal CK2 in response to the clock signal CK1. In some embodiments, the clock signal CK2 is inverted from the clock signal CK1. An input terminal of inverter I5 is configured to receive the clock signal CK1. The input terminal of inverter I5 is coupled to the output terminal of NOR logic gate NOR1. An output terminal of inverter I5 is coupled to an input terminal of inverter I6 and is configured to output the clock signal CK2. Inverter I5 and NOR logic gate NOR1 are part of a circuit 201.

Inverter I6 is configured to generate the clock signal CKP_WL in response to the clock signal CK2. In some embodiments, the clock signal CKP_WL is inverted from the clock signal CK2. In some embodiments, the clock signal CKP_WL is a delayed version of the clock signal CK1. An input terminal of inverter I6 is coupled to the output terminal of inverter I5 and is configured to receive the clock signal CK2. An output terminal of inverter I6 is coupled to a first input terminal of NAND logic gate NAND1 and the input terminal of inverter I1. For ease of illustration, the input terminal of inverter I1 is not shown as being coupled to the output terminal of inverter I6. The output terminal of inverter I6 is configured to output the clock signal CKP_WL.

Control circuit 202 further includes a NAND logic gate NAND1.

The first input terminal of NAND logic gate NAND1 is configured to receive the clock signal CKP_WL. The first input terminal of NAND logic gate NAND1 is coupled to the output terminal of inverter I6.

A second input terminal of NAND logic gate NAND1 is configured to receive a decoder signal pdec_x. The second input terminal of NAND logic gate NAND1 is coupled to a source of the decoder signal pdec_x (not shown). In some embodiments, the decoder signal pdec_x is useable to select a corresponding row of memory cells in memory cell array 206.

An output terminal of NAND logic gate NAND1 is configured to output a decoder signal ND1. NAND logic gate NAND1 is configured to generate the decoder signal ND1 based on the clock signal CKP_WL and the decoder signal pdec_x. An output terminal of NAND logic gate NAND1 is coupled to an input terminal of an inverter I7.

Control circuit 202 further includes an inverter I7.

Inverter I7 is configured to generate a decoder signal DEC_X in response to the decoder signal ND1. In some embodiments, the decoder signal DEC_X is inverted from the decoder signal ND1. An input terminal of inverter I7 is configured to receive the decoder signal ND1. The input terminal of inverter I7 is coupled to the output terminal of NAND logic gate NAND1. An output terminal of inverter I7 is coupled to an input terminal of a post-decoder circuit 240, and is configured to output the decoder signal DEC_X. In some embodiments, the decoder signal DEC_X is an address signal of a corresponding row of memory cells in the memory cell array 206. In some embodiments, the decoder signal DEC_X is useable to select a corresponding row of memory cells in the memory cell array 206.

Other configurations, other types of circuit elements or other numbers of circuit elements in control circuit 202 are within the scope of the present disclosure.

WL driver circuit 208 is coupled to the control circuit 202 by at least a decoder line (not labelled) and the tracking bit line TBL. WL driver circuit 208 is further coupled to the memory cell array 206 by at least the word line WL. For ease of illustration, WL driver circuit 208 is shown as being coupled to the memory cell array 206 by a single word line WL, but a plurality of words lines are coupled between the WL driver circuit 208 and the memory cell array 206. WL driver circuit 208 is further coupled to the IO circuit 204 by at least the tracking word line TWL.

WL driver circuit 208 is configured to control the memory cell array 206 by at least a word line signal WL. WL driver circuit 208 is configured to generate the word line signal WL in response to the decoder signal DEC_X.

In some embodiments, WL driver circuit 208 is further configured to control the control circuit 202 by at least the tracking bit line signal TRKBL. In some embodiments, WL driver circuit 208 is further configured to generate the tracking bit line signal TRKBL in response to the tracking word line signal TRKWL.

WL driver circuit 208 includes a post-decoder circuit 240.

Post-decoder circuit 240 is configured to generate an inverted word line signal WLB in response to the decoder signal DEC_X.

In some embodiments, the post-decoder circuit 240 includes one or more word line decoder circuits coupled to a corresponding word line bar/word line and a corresponding row of memory cells in memory cell array 206. In some embodiments, the post-decoder circuit 240 is configured to select a corresponding row of memory cells in the memory cell array 206 by a corresponding word line signal WL. In some embodiments, each of the one or more word line decoder circuits includes a corresponding NAND logic gate (not shown) or NOR logic gate (not shown). Other type of word line decoder circuits in the post-decoder circuit 240 are within the scope of the present disclosure.

An input terminal of the post-decoder circuit 240 is configured to receive the decoder signal DEC_X. The input terminal of the post-decoder circuit 240 is coupled to the output terminal of inverter I7.

An output terminal of the post-decoder circuit 240 is configured to output the inverted word line signal WLB. The output terminal of the post-decoder circuit 240 is coupled to a gate of PMOS transistor P6 and a gate of NMOS transistor N6.

WL driver circuit 208 further includes the PMOS transistor P6 and the NMOS transistor N6.

PMOS transistor P6 and NMOS transistor N6 are configured as an inverter (not labelled) and are configured to generate the word line signal WL in response to the inverted word line signal WLB. In some embodiments, the word line signal WL is inverted from the inverted word line signal WLB.

A source of PMOS transistor P6 is coupled to a second voltage supply having a supply voltage VDDM. In some embodiments, the supply voltage VDDM is greater than the supply voltage VDD. In some embodiments, the supply voltage VDDM is less than the supply voltage VDD. In some embodiments, the supply voltage VDDM has a voltage swing ranging from VDDM to VSS. In some embodiments, the supply voltage VDD has a voltage swing ranging from VDD to VSS. In some embodiments, memory circuit 200 is a dual-rail circuit implementation using signals (e.g., word line signal WL and signal TRKBL1B) of two different voltage domains.

Each of a gate of PMOS transistor P6 and a gate of NMOS transistor N6 are coupled together and are configured to receive the word line signal WLB from the output terminal of the post-decoder circuit 240.

Each of a drain of PMOS transistor P6 and a drain of NMOS transistor N6 are coupled together and are further coupled to the memory cell array 206 by the word line WL. A source of NMOS transistor N6 is coupled to a reference voltage supply VSS.

WL driver circuit 208 further includes a PMOS transistor P1.

A source of PMOS transistor P1 is coupled to the second voltage supply having the supply voltage VDDM. In some embodiments, PMOS transistor P1 is configured to set the tracking bit line signal TRKBL on the tracking bit line TBL to the supply voltage VDDM.

Each of a gate of PMOS transistor P1, a gate of NMOS transistor N3, a gate of NMOS transistor N4, a tracking word line TWL and an output terminal of inverter I2 are coupled together. Each of the gate of PMOS transistor P1, the gate of NMOS transistor N3 and the gate of NMOS transistor N4 are configured to receive the tracking word line signal TRKWL from the tracking word line TWL.

Each of a drain of PMOS transistor P1, a drain/source of NMOS transistor N1, a drain/source of NMOS transistor N2, a drain/source of NMOS transistor N3, a drain/source of NMOS transistor N4, the gate of PMOS transistor P2, the gate of PMOS transistor P4, and the gate of NMOS transistor N5 are coupled together.

At least one of the drain of PMOS transistor P1, the drain/source of NMOS transistor N1, the drain/source of NMOS transistor N2, the drain/source of NMOS transistor N3 or the drain/source of NMOS transistor N4 is coupled to at least one of the gate of PMOS transistor P2, the gate of PMOS transistor P4, or the gate of NMOS transistor N5 by the tracking bit line TBL.

Other configurations, other types of circuit elements or other numbers of circuit elements in WL driver circuit 208 are within the scope of the present disclosure.

Memory cell array 206 is coupled to the control circuit 202 by the tracking bit line TBL. Memory cell array 206 is further coupled to the WL driver circuit 208 by at least the word line WL. Memory cell array 206 is further coupled to the IO circuit 204 by at least the tracking word line TWL.

Memory cell array 206 includes tracking cells 206a and memory cells 206b.

Tracking cells 206a are configured to track one or more memory cells 206b of memory cell array 206. Tracking cells 206a include one or more of NMOS transistor N1, NMOS transistor N2, NMOS transistor N3 or NMOS transistor N4. In some embodiments, at least one of NMOS transistor N1, NMOS transistor N2, NMOS transistor N3 or NMOS transistor N4 is configured to set the tracking bit line signal TRKBL on the tracking bit line TBL to a logic 0 or to around the reference supply voltage VSS.

In some embodiments, each of the gate of NMOS transistor N1 and the gate of NMOS transistor N2 is configured to receive a logic 0. In some embodiments, each of the gate of NMOS transistor N1 and the gate of NMOS transistor N2 are configured to receive the reference supply voltage VSS from a reference voltage supply. In some embodiments, each of the gate of NMOS transistor N1 and the gate of NMOS transistor N2 are coupled together.

At least one of the source/drain of NMOS transistor N1, the source/drain of NMOS transistor N2, the source/drain of NMOS transistor N3 or the source/drain of NMOS transistor N4 is configured to receive a logic 0. At least one of the source/drain of NMOS transistor N1, the source/drain of NMOS transistor N2, the source/drain of NMOS transistor N3 or the source/drain of NMOS transistor N4 is configured to receive the reference supply voltage VSS from a reference voltage supply. At least one of the source/drain of NMOS transistor N1, the source/drain of NMOS transistor N2, the source/drain of NMOS transistor N3 or the source/drain of NMOS transistor N4 are coupled together.

Memory cells 206b include one or more memory cells (not shown). In some embodiments, memory cells 206b include one or more of memory cell 112 in FIG. 1.

Other configurations, other types of circuit elements or other numbers of circuit elements in memory cell array 206 are within the scope of the present disclosure.

IO circuit 204 is coupled to at least one of the control circuit 202, the WL driver circuit 208 or the memory cell array 206 by the tracking word line TWL. IO circuit 204 is configured to set the tracking word line signal TRKWL on the tracking word line TWL.

Other configurations, other types of circuit elements or other numbers of circuit elements in IO circuit 204 are within the scope of the present disclosure.

In some embodiments, by memory circuit 200 including the WL adaptive delay circuit 230, the clock signal CKPBD can be delayed from the clock signal CKPB. In some embodiments, by delaying the clock signal CKPBD, the clock signal CKP_WL can also be delayed without reducing a pulse width of the clock signal CKP_WL, thereby resulting in a more flexible memory design than other approaches.

Waveforms

Figure 3:
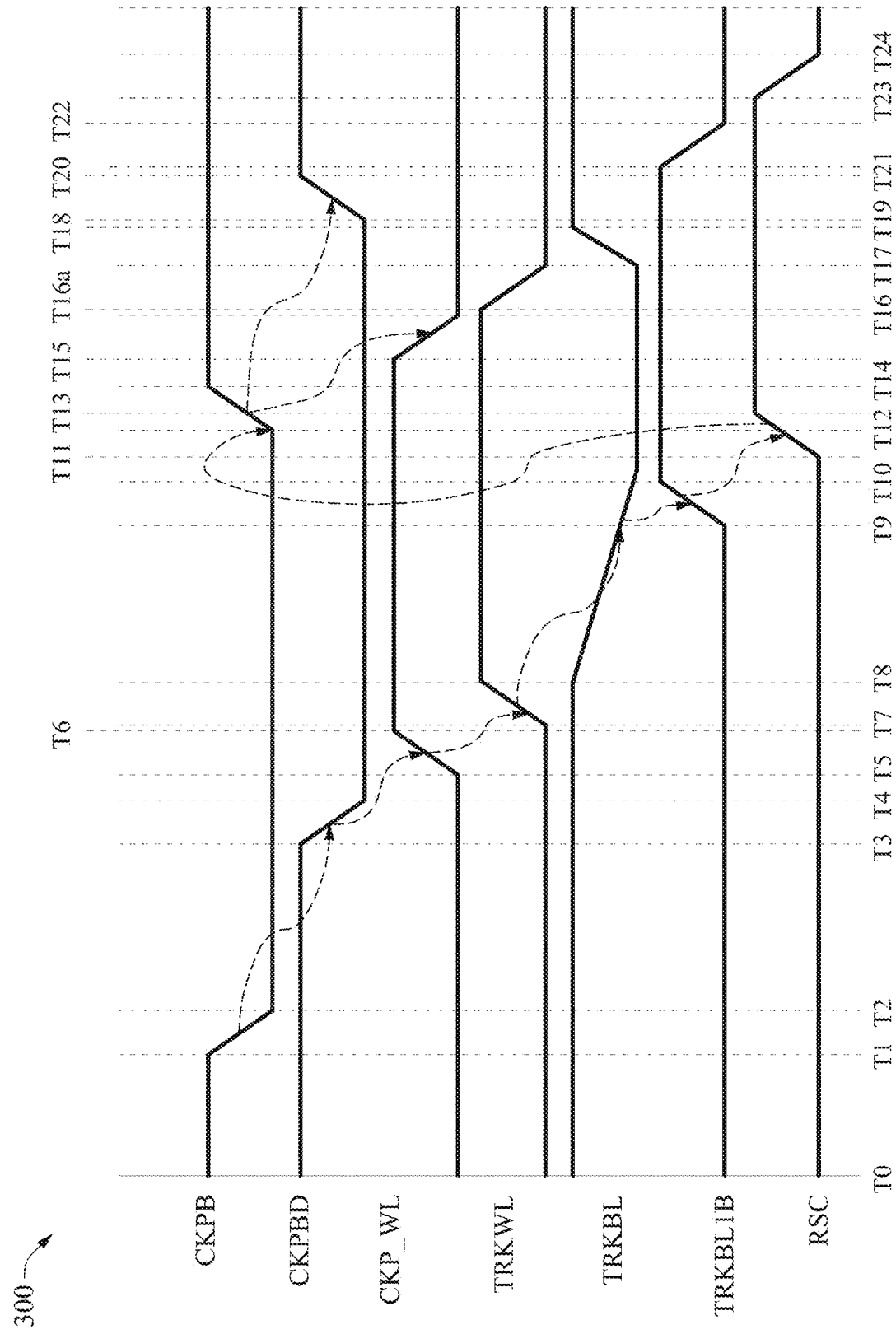
FIG. 3 is a timing diagram of waveforms of a memory circuit, such as the memory circuit in FIG. 2 or the memory circuit in FIG. 4, in accordance with some embodiments.
Figure 4:
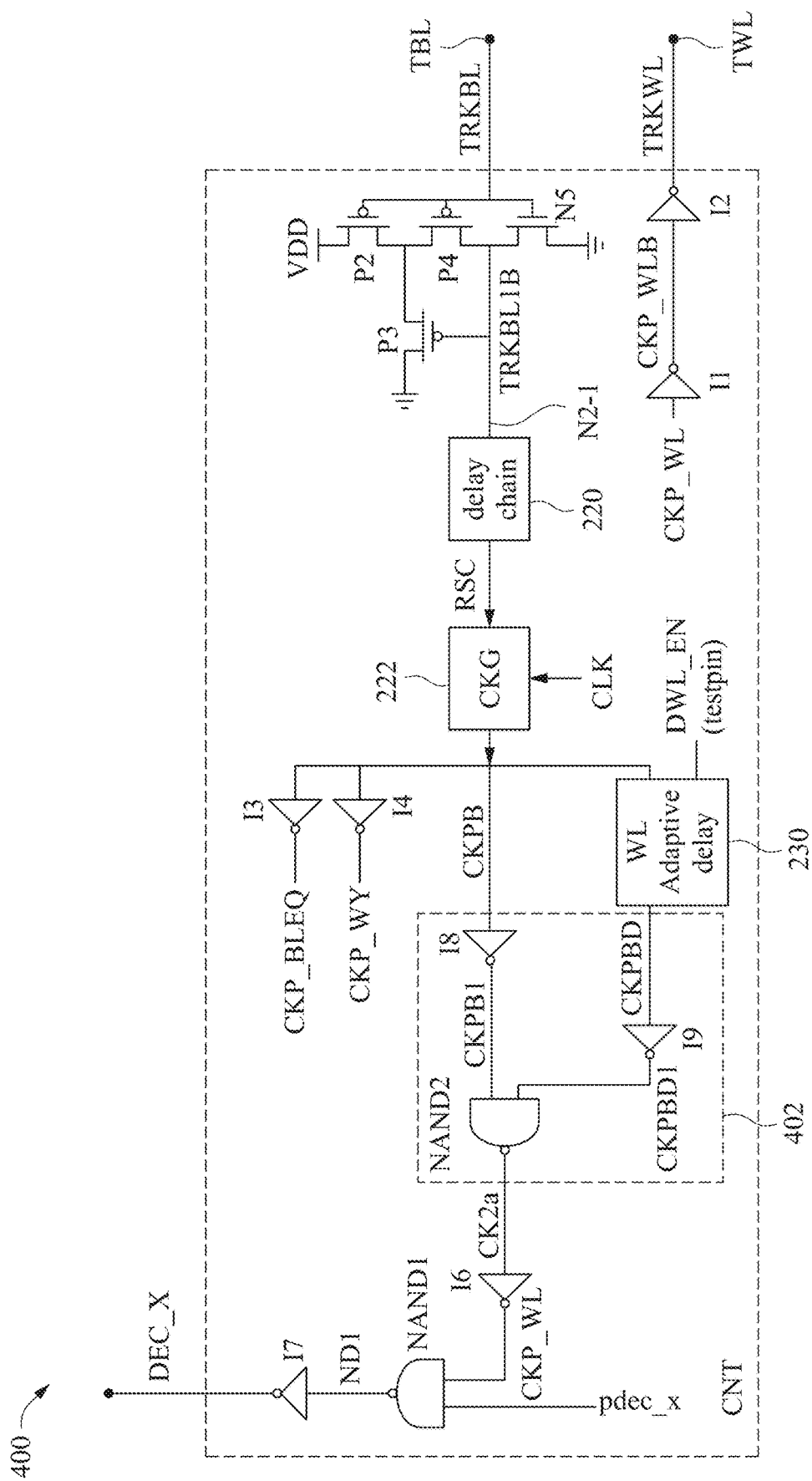
FIG. 4 is a circuit diagram of a control circuit, in accordance with some embodiments.

FIG. 3 is a timing diagram 300 of waveforms of a memory circuit, such as memory circuit 200 in FIG. 2 or memory circuit 400 in FIG. 4, in accordance with some embodiments.

In some embodiments, one or more read operations or write operations are applied to at least one memory cell in a single column of memory cell array 206b in at least memory circuit 200 of FIG. 2, and timing diagram 300 corresponds to waveforms during the one or more read operations or write operations of the at least one memory cell in the single column of memory cell array 206b in at least memory circuit 200 of FIG. 2.

In some embodiments, one or more read operations or write operations of the memory banks in at least memory circuit 100 of FIG. 1 are applied to at least one of memory partition 102A, 102B, 102C or 102D, and timing diagram 300 corresponds to waveforms during the read operations or write operations of at least one of memory partition 102A, 102B, 102C or 102D.

Timing diagram 300 includes waveforms of the clock signal CKPB, the clock signal CKPBD, the clock signal CKP_WL, the tracking word line signal TRKWL, the tracking bit line signal TRKBL, the signal TRKBL1B, or the signal RSC.

In some embodiments, at time T0, the enable signal DWL_EN is logically high, thereby enabling WL adaptive delay circuit 230. At time T0, the clock signal CKPB is logically high, the clock signal CKPBD is logically high, the clock signal CKP_WL is logically low, the tracking word line signal TRKWL is logically low, the tracking bit line signal TRKBL is logically high, the signal TRKBL1B is logically low, and the line signal RSC is logically low.

In some embodiments, at time T1, the clock signal CKP1 is logically low and the enable signal DWL_EN is logically high, thereby enabling circuit 500.

At time T1, the clock signal CKPB transitions from logically high to logically low. In some embodiments, at time T1, the WL adaptive delay circuit 230 is enabled by at least enable signal DWL_EN. In some embodiments, in response to the clock signal CKPB transitioning from logically high to logically low, thereby causes the WL adaptive delay circuit 230 to cause the clock signal CKPBD to transition from logically high to logically low at time T3. In some embodiments, since the WL adaptive delay circuit 230 is enabled, the transition of the clock signal CKPBD from logically high to logically low occurs at time T3 (described below) which is a delay from time T1. In some embodiments, if the WL adaptive delay circuit 230 was disabled, then the transition of the clock signal CKPBD from logically high to logically low would occur around time T1.

At time T2, the clock signal CKPB is logically low.

At time T3, the clock signal CKPBD transitions from logically high to logically low. In response to at least the clock signal CKPB transitioning from logically high to logically low causes the transition of the clock signal CKPBD from logically high to logically low by the WL adaptive delay circuit 230 since the WL adaptive delay circuit 230 is enabled.

At time T4, the clock signal CKPBD is logically low.

At time T5, the clock signal CKP_WL transitions from logically low to logically high in response to the clock signal CKPB being logically low and the transition of the clock signal CKPBD from logically high to logically low. For example, in response to the clock signal CKPB being logically low and the transition of the clock signal CKPBD from logically high to logically low, NOR logic gate NOR1 causes the clock signal CK1 to transition to be logically high. In response to the clock signal CK1 being logically high, the inverter I5 causes the clock signal CK2 to transition to be logically low. In response to the clock signal CK2 being logically low, the inverter I6 causes the clock signal CKP_WL to transition from logically low to logically high.

At time T6, the clock signal CKP_WL is logically high.

At time T7, the tracking word line signal TRKWL transitions from logically low to logically high in response to the clock signal CKP_WL transitioning from logically low to logically high. For example, in response to the clock signal CKP_WL transitioning from logically low to logically high, the inverter I1 causes the clock signal CKP_WLB to transition from logically high to logically low. In response to the clock signal CKP_WLB transitioning from logically high to logically low, the inverter I2 causes the tracking word line signal TRKWL to transition from logically low to logically high.

At time T8, the tracking word line signal TRKWL is logically high.

At time T8, the tracking bit line signal TRKBL transitions from logically high to logically low in response to the tracking word line signal TRKWL transitioning from logically low to logically high. For example, in response to the tracking word line signal TRKWL transitioning from logically low to logically high, the PMOS transistor P1 is turned off, thereby decoupling the voltage supply VDDM from the tracking bit line TBL. In some embodiments, in response to the tracking word line signal TRKWL transitioning from logically low to logically high, the NMOS transistors N3 and N4 are turned on, thereby coupling the drain/source of each of NMOS transistors N3 and N4 to the tracking bit line TBL. In some embodiments, by coupling the drain/source of each of NMOS transistors N3 and N4 to the tracking bit line TBL, NMOS transistors N3 and N4 are configured to pull the tracking bit line signal TRKBL towards the voltage of the drain/source of each of NMOS transistors N3 and N4 (e.g., logic 0) which is logically low. In these embodiments, NMOS transistors N3 and N4 are turned off.

At time T9, the signal TRKBL1B transitions from logically low to logically high in response to the tracking bit line signal TRKBL transitioning from logically high to logically low.

In some embodiments, the tracking bit line signal TRKBL at time T9 is sufficiently low enough to thereby cause NMOS transistor N5 to begin to turn off and PMOS transistors P2 and P4 to begin to turn on. In some embodiments, in response to NMOS transistor N5 beginning to turn off and PMOS transistors P2 and P4 beginning to turn on, PMOS transistors P2 and P4 begin to pull a node N2-1 towards the first supply voltage VDD, thereby causing the signal TRKBL1B to transition from logically low to logically high and turning off PMOS transistor P3.

At time T10, the signal TRKBL1B is logically high.

At time T11, the tracking bit line signal TRKBL is logically low.

At time T11, the signal RSC transitions from logically low to logically high in response to the signal TRKBL1B transitioning from logically low to logically high. In some embodiments, the signal RSC is delayed from the signal TRKBL1B.

At time T12, the clock signal CKPB transitions from logically low to logically high in response to the signal RSC transitioning from logically low to logically high. In some embodiments, the clock generating circuit 222 is reset by the signal RSC transitioning from logically low to logically high thereby causing the clock generating circuit 222 to cause the clock signal CKPB to transition from logically low to logically high.

At time T13, the signal RSC is logically high.

At time T13, the clock signal CKPB transitions from logically low to logically high in response to the signal RSC transitioning from logically low to logically high.

In some embodiments, the WL adaptive delay circuit 230 causes the clock signal CKPBD to transition from logically low to logically high at time T19 in response to the clock signal CKPB transitioning from logically low to logically high. In some embodiments, because the WL adaptive delay circuit 230 is enabled, the transition of the clock signal CKPBD from logically low to logically high occurs at time T19 (described below) which is a delay from time T13. In some embodiments, if the WL adaptive delay circuit 230 was disabled, then the transition of the clock signal CKPBD from logically low to logically high would occur around time T13.

In some embodiments, the NOR logic gate NOR1 causes the clock signal CK1 to transition from logically high to logically low in response to the clock signal CKPB transitioning from logically low to logically high, which causes the inverter I5 to cause the clock signal CK2 to transition from logically low to logically high, which causes the inverter I6 to cause the clock signal CKP_WL to transition from logically high to logically low at time T15 (described below).

At time T14, the clock signal CKPB is logically high.

At time T15, the clock signal CKP_WL transitions from logically high to logically low in response to the clock signal CKPB transitioning from logically low to logically high.

At time T16, the clock signal CKP_WL is logically low.

At time T16a, the tracking word line signal TRKWL transitions from logically high to logically low in response to the clock signal CKP_WL transitioning from logically high to logically low. For example, in response to the clock signal CKP_WL transitioning from logically high to logically low, the inverter I1 causes the clock signal CKP_WLB to transition from logically low to logically high. In response to the clock signal CKP_WLB transitioning from logically low to logically high, the inverter I2 causes the tracking word line signal TRKWL to transition from logically high to logically low.

At time T17, the tracking word line signal TRKWL is logically low.

At time T17, the tracking bit line signal TRKBL transitions from logically low to logically high in response to the tracking word line signal TRKWL transitioning from logically high to logically low. For example, in response to the tracking word line signal TRKWL transitioning from logically high to logically low, the PMOS transistor P1 is turned on, thereby coupling the PMOS transistor P1 to voltage supply VDDM. In some embodiments, in response to the tracking word line signal TRKWL transitioning from logically high to logically low, the NMOS transistors N3 and N4 are turned off, thereby decoupling the drain/source of each of NMOS transistors N3 and N4 from the tracking bit line TBL.

At time T18, the tracking bit line signal TRKBL is logically high.

At time T19, the clock signal CKPBD transitions from logically low to logically high. The clock signal CKPB transitioning from logically low to logically high causes the transition of the clock signal CKPBD from logically low to logically high by the WL adaptive delay circuit 230 since the WL adaptive delay circuit 230 is enabled.

At time T20, the clock signal CKPBD is logically high.

At time T21, the signal TRKBL1B transitions from logically high to logically low in response to the tracking bit line signal TRKBL transitioning from logically low to logically high.

For example, in response to the tracking bit line signal TRKBL transitioning from logically low to logically high, the NMOS transistor N5 turns on and PMOS transistors P2 and P4 turn off. In some embodiments, in response to NMOS transistor N5 turning on and PMOS transistors P2 and P4 turning off, NMOS transistor N5 pulls node N2-1 towards the reference supply voltage VSS, thereby causing the signal TRKBL1B to transition from logically high to logically low and turning on PMOS transistor P3.

At time T22, the signal TRKBL1B is logically low.

At time T23, the signal RSC transitions from logically high to logically low in response to the signal TRKBL1B transitioning from logically high to logically low.

At time T24, the signal RSC is logically low.

After time T24, the next read operation or write operation of the at least one memory cell in the single column of memory cell array 206b in at least memory circuit 200 of FIG. 2 occurs.

In some embodiments, after time T24, waveform 300 is repeated and is therefore similar to time TO, and similar detailed description is therefore omitted.

In some embodiments, timing diagram 300 causes at least memory circuit 200 or 400 to achieve one or more of the benefits described herein.

In some embodiments, while timing diagram 300 is described with respect to memory circuit 200, timing diagram 300 is also applicable to memory circuit 400 in a similar manner and is not described for brevity.

Other configurations of timing diagram 300 are within the scope of the present disclosure.

Control Circuit:

FIG. 4 is a circuit diagram of a control circuit 400, in accordance with some embodiments.

Control circuit 400 is a variation of control circuit 202 of FIG. 2, and similar detailed description is therefore omitted. For example, control circuit 400 illustrates a non-limiting example where a circuit 402 replaces the circuit 201 (e.g., NOR logic gate NOR1 and inverter I5) of control circuit 202 of FIG. 2, and similar detailed description is therefore omitted.

Control circuit 400 includes circuit 402, inverter I1, inverter I2, PMOS transistor P2, PMOS transistor P3, PMOS transistor P4, NMOS transistor N5, delay chain circuit 220, clock generating circuit 222, inverter I3, inverter I4, WL adaptive delay circuit 230, inverter I6, NAND logic gate NAND1, and inverter I7.

In comparison with control circuit 202 of FIG. 2, circuit 402 of FIG. 4 replaces circuit 201 of FIG. 2, and similar detailed description is therefore omitted. In some embodiments, circuit 402 is functionally equivalent to the NOR logic gate NOR1 and the inverter I5 of circuit 201 of FIG. 2.

Circuit 402 includes an inverter I8, an inverter I9 and a NAND logic gate NAND2.

Inverter I8 is configured to generate a clock signal CKPB1 in response to the clock signal CKPB. In some embodiments, the clock signal CKPB1 is inverted from the clock signal CKPB. An input terminal of inverter I8 is configured to receive the clock signal CKPB. The input terminal of inverter I8 is coupled to the output terminal of clock generating circuit 222. An output terminal of inverter I8 is configured to output the clock signal CKPB1. The output terminal of inverter I8 is coupled to a first input terminal of NAND logic gate NAND2.

Inverter I9 is configured to generate a clock signal CKPBD1 in response to the clock signal CKPBD. In some embodiments, the clock signal CKPBD1 is inverted from the clock signal CKPBD. An input terminal of inverter I9 is configured to receive the clock signal CKPBD. The input terminal of inverter I9 is coupled to the output terminal of WL adaptive delay circuit 230. An output terminal of inverter I9 is configured to output the clock signal CKPBD1. The output terminal of inverter I9 is coupled to a second input terminal of NAND logic gate NAND2.

The first input terminal of NAND logic gate NAND2 is configured to receive the clock signal CKPB1. The first input terminal of NAND logic gate NAND2 is coupled to the output terminal of inverter I8.

The second input terminal of NAND logic gate NAND2 is configured to receive the clock signal CKPBD1. The second input terminal of NAND logic gate NAND2 is coupled to the output terminal of inverter I9.

An output terminal of NAND logic gate NAND2 is configured to output a clock signal CK2a. In some embodiments, clock signal CK2a is the clock signal CK2 of FIG. 2. NAND logic gate NAND2 is configured to generate the clock signal CK2a based on the clock signal CKPB1 and the clock signal CKPBD1. An output terminal of NAND logic gate NAND2 is coupled to the input terminal of inverter I6.

In some embodiments, control circuit 400 operates to achieve one or more of the benefits described herein.

Other configurations of control circuit 400 are within the scope of the present disclosure. In some embodiments, operation of control circuit 400 is the same as the operation of control circuit 202, and therefore the timing diagram 300 of FIG. 3 is also applicable to control circuit 400 and is not described for brevity.

Figure 5:
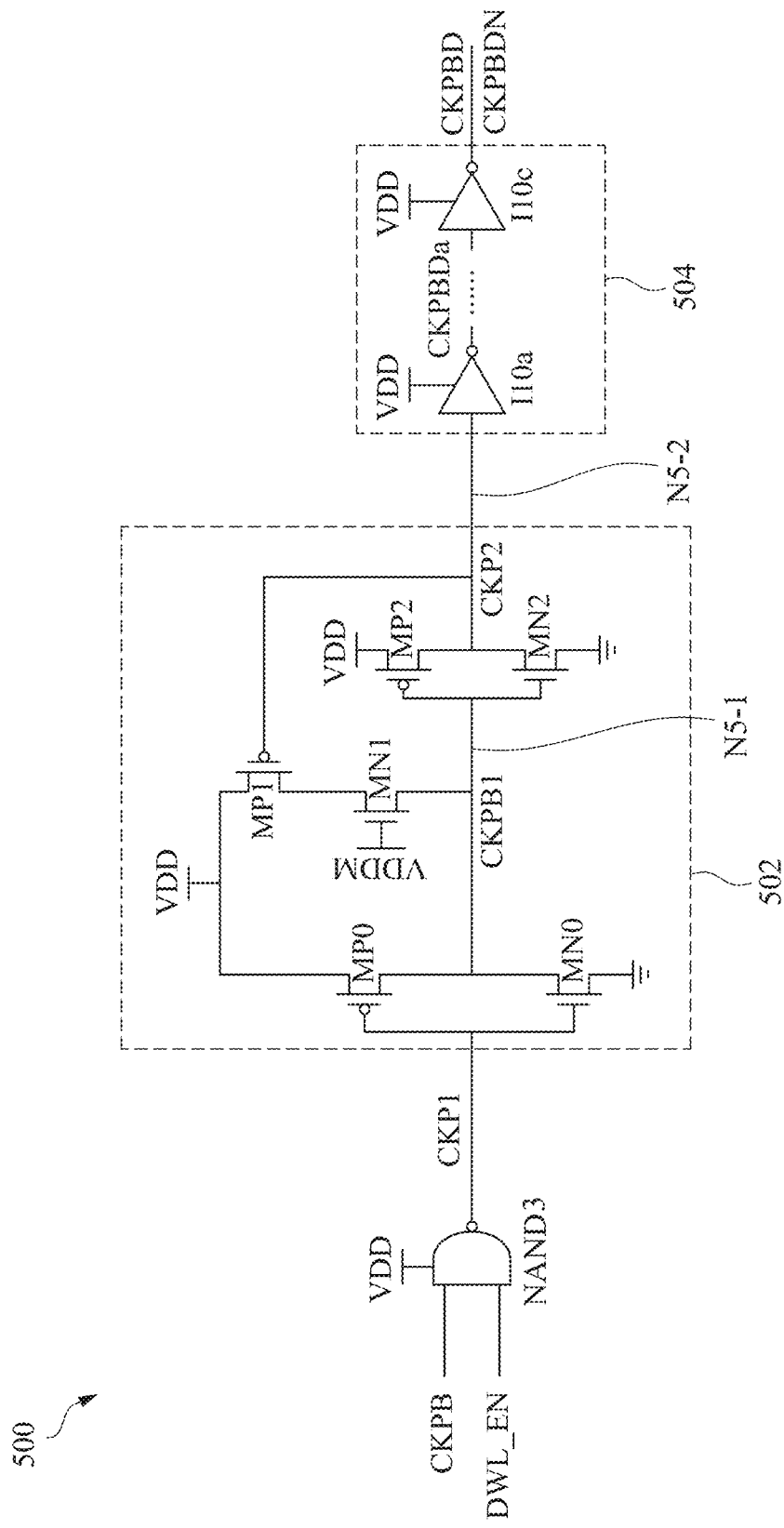
FIG. 5 is a circuit diagram of a circuit, in accordance with some embodiments.

Circuit:

FIG. 5 is a circuit diagram of a circuit 500, in accordance with some embodiments.

Circuit 500 is an embodiment of the WL adaptive delay circuit 230 of FIGS. 2 and 4, and similar detailed description is therefore omitted. Circuit 700 of FIG. 7 (described below), circuit 800 of FIG. 8 (described below) and circuit 900 of FIG. 9 (described below) are embodiments of the WL adaptive delay circuit 230 of FIGS. 2 and 4, and similar detailed description is therefore omitted.

Circuit 500 includes a NAND logic gate NAND3.

The NAND logic gate NAND3 is coupled to the clock generating circuit 222. The NAND logic gate NAND3 is coupled to the first voltage supply having the supply voltage VDD.

A first input terminal of NAND logic gate NAND3 is configured to receive the clock signal CKPB. The first input terminal of NAND logic gate NAND3 is coupled to the output terminal of the clock generating circuit 222.

A second input terminal of NAND logic gate NAND3 is configured to receive the enable signal DWL_EN. The second input terminal of NAND logic gate NAND3 is coupled to a source (not shown) of the enable signal DWL_EN.

An output terminal of NAND logic gate NAND3 is configured to output the clock signal CKP1. NAND logic gate NAND3 is configured to generate the clock signal CKP1 signal based on the clock signal CKPB and the enable signal DWL_EN. Each of the output terminal of NAND logic gate NAND3, a gate of PMOS transistor MP0 and a gate of NMOS transistor MN0 are coupled together. In some embodiments, NAND logic gate NAND3 is replaced by a NOR logic gate similar to NOR logic gate NOR1, and similar detailed description is omitted.

Circuit 500 further includes a PMOS transistor MP0, a PMOS transistor MP1, a PMOS transistor MP2, an NMOS transistor MN0, an NMOS transistor MN1, and an NMOS transistor MN2. PMOS transistor MP0, PMOS transistor MP1, PMOS transistor MP2, NMOS transistor MN0, NMOS transistor MN1, and NMOS transistor MN2 are part of circuit 502. In some embodiments, circuit 502 is a delay circuit.

PMOS transistor MP0 and NMOS transistor MN0 are configured as an inverter (not labelled) and are configured to generate the clock signal CKPB1 in response to the clock signal CKP1. In some embodiments, the clock signal CKPB1 is inverted from the clock signal CKP1.

A source of PMOS transistor MP0 is coupled to the first voltage supply having the supply voltage VDD. A source of NMOS transistor MN0 is coupled to a reference voltage supply VSS.

Each of a gate of PMOS transistor MP0 and a gate of NMOS transistor MN0 are coupled together and are configured to receive the clock signal CKP1 from the output terminal of the NAND logic gate NAND3.

Each of a drain of PMOS transistor MP0, a drain of NMOS transistor MN0, a source of NMOS transistor MN1, a gate of PMOS transistor MP2 and a gate of NMOS transistor MN2 are coupled together.

A source of PMOS transistor MP1 is coupled to the first voltage supply having the supply voltage VDD.

Each of a gate of PMOS transistor MP1, a drain of PMOS transistor MP2, a drain of NMOS transistor MN2 and an input terminal of inverter I10a of a delay chain circuit 504 are coupled together. The gate of PMOS transistor MP1 is configured to receive a clock signal CKP2 from the drain of PMOS transistor MP2 and the drain of NMOS transistor MN2.

A drain of PMOS transistor MP1 and a drain of NMOS transistor MN1 are coupled together.

A gate of NMOS transistor MN1 is coupled to the second voltage supply having the supply voltage VDDM. The gate of NMOS transistor MN1 is configured to receive the supply voltage VDDM from the second voltage supply.

In some embodiments, at least one of PMOS transistor MP0 or NMOS transistor MN0 is configured to adjust or set the clock signal CKPB1 in response to the clock signal CKP1.

In some embodiments, at least one of PMOS transistor MP1 or NMOS transistor MN1 is configured to adjust or set the clock signal CKPB1 in response to at least the clock signal CKP2.

Figure 6:
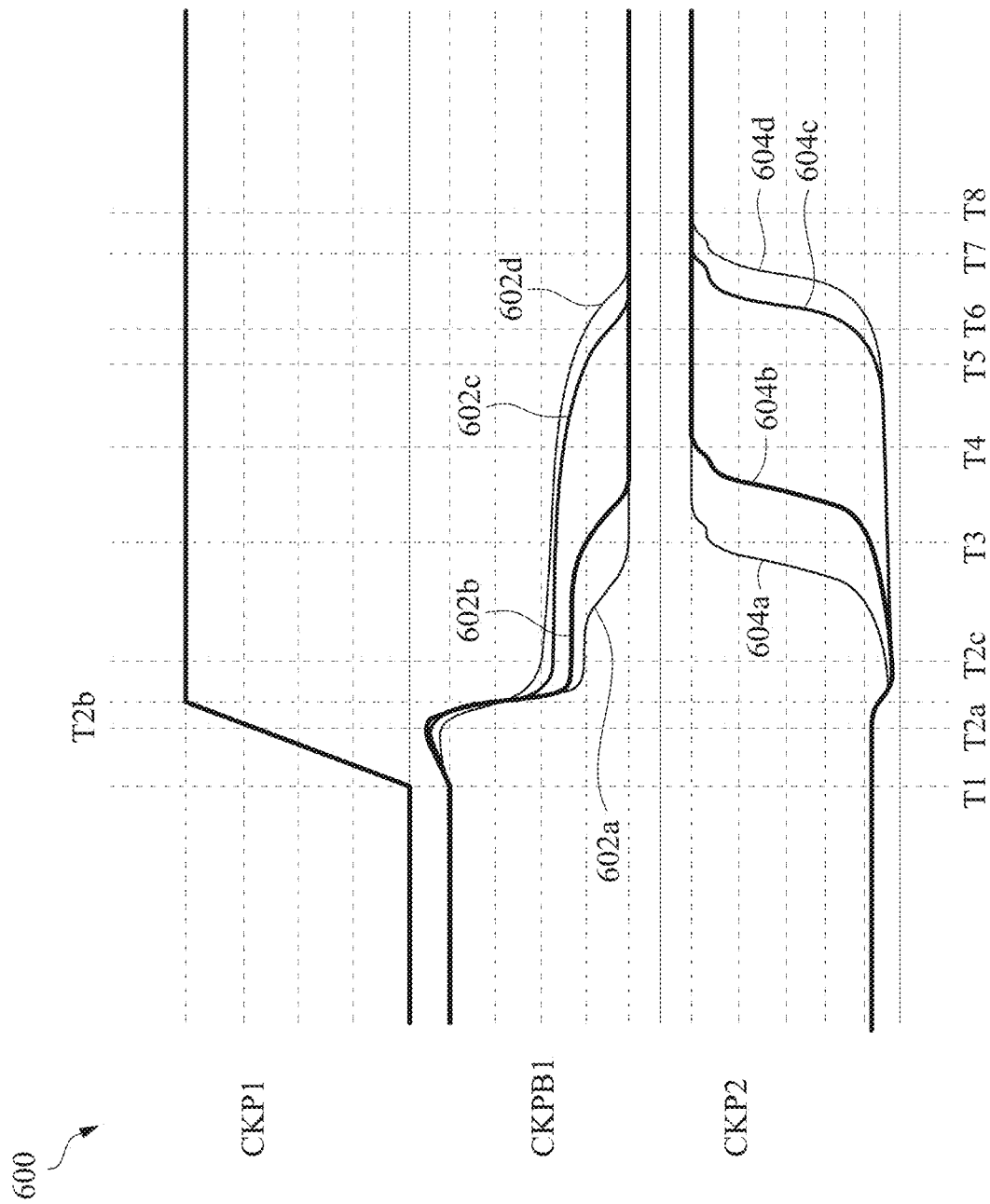
FIG. 6 is a timing diagram of waveforms of a circuit, such as the circuit in FIG. 5, the circuit in FIG. 7, the circuit in FIG. 8 or the circuit in FIG. 9, in accordance with some embodiments.

In some embodiments, NMOS transistor MN1 is configured to delay a transition of the clock signal CKPB1 from logically high to logically low (shown in FIG. 6—see curves 602a, 602b, 602c or 602d), thereby delaying a transition of the clock signal CKP2 from logically low to logically high (shown in FIG. 6—curves 604a, 604b, 604c or 604d).

In some embodiments, a difference or gap between the second voltage of the voltage supply VDDM and the first voltage of voltage supply VDD causes NMOS transistor MN1 to turn on, thereby causing a delay in transitions of the clock signal CKP2, thereby further causing a delay in transitions of the clock signal CKPBD. Further details of the operation of NMOS transistor MN2 are discussed below in FIG. 6.

PMOS transistor MP2 and NMOS transistor MN2 are configured as an inverter (not labelled) and are configured to generate the clock signal CKP2 in response to the clock signal CKPB1. In some embodiments, the clock signal CKP2 is inverted from the clock signal CKPB1.

A source of PMOS transistor MP2 is coupled to the first voltage supply having the supply voltage VDD. A source of NMOS transistor MN2 is coupled to a reference voltage supply VSS.

Each of a gate of PMOS transistor MP2 and a gate of NMOS transistor MN2 are coupled together and are configured to receive the clock signal CKPB1.

Each of a drain of PMOS transistor MP2 and a drain of NMOS transistor MN2 are coupled together and configured to output the clock signal CKP2. The clock signal CKP2 is sent to the gate of PMOS transistor MP1 as part of a feed-back loop.

Circuit 500 further includes a delay chain circuit 504.

Delay chain circuit 504 is configured to generate a clock signal CKPBD in response to the clock signal CKP2. In some embodiments, the clock signal CKPBD is a delayed and inverted version of the clock signal CKP2. Delay chain circuit 504 is coupled to the first voltage supply having the supply voltage VDD.

Delay chain circuit 504 has N stages (collectively referred to as "a set of stages" (not labelled)), where N is an integer corresponding to the number of stages and inverters I10a, I10b, . . . , I10N in delay chain circuit 504. Each stage of the set of stages is configured to generate a corresponding clock signal CKPBDa, CKPBDb, . . . , CKPBDN. In some embodiments, clock signal CKPBDN is the clock signal CKPBD. The number of stages N of the set of stages (not labelled) is odd. A number of clock signals CKPBDa, CKPBDb, . . . , CKPBDN is odd, and is equal to integer N. Other numbers of stages N or clock signals CKPBDa, CKPBDb, . . . , CKPBDN are within the scope of the present disclosure.

Delay chain circuit 504 includes N inverters I10a, I10b, . . . , I10N (collectively referred to as "a set of inverters I10") coupled together in series. The set of inverters I10 is coupled to the first voltage supply having the supply voltage VDD.

In some embodiments, each inverter of the set of inverters I10 corresponds to a stage N of the set of stages (not labelled). A number of inverters of the set of inverters I10 is odd. Each inverter of the set of inverters I10 is configured to generate a corresponding clock signal CKPBDa, CKPBDb, . . . , CKPBDN. In some embodiments, the Nth inverter of the set of inverters I10 is configured to generate a corresponding clock signal that is the clock signal CKPBD.

Each inverter I10a, I10b, . . . , I10N of the set of inverters is configured to invert the clock signal (e.g., CKP2, CKPBDa, . . . , CKPBDN-1) received on the corresponding input terminal thereby generating an inverted clock signal (e.g., CKPBDa, CKPBDb, . . . , CKPBDN), and to output the inverted clock signal (e.g., CKPBDa, CKPBDb, . . . , CKPBDN) on the corresponding output terminal.

An input terminal of inverter I10a is configured to receive the clock signal CKP2. An output terminal of inverter I10a is coupled to an input terminal of inverter I10b. An output terminal of inverter I10b is coupled to an input terminal of inverter I10N-1. An output terminal of inverter I10N-1 is coupled to an input terminal of inverter I10N.

Other configurations, other types of circuit elements or other numbers of circuit elements in at least one of circuit 502, delay chain circuit 504 or circuit 500 are within the scope of the present disclosure.

In some embodiments, circuit 500 operates to achieve one or more benefits described herein.

Other configurations of circuit 500 are within the scope of the present disclosure.

Waveforms

Figure 7:
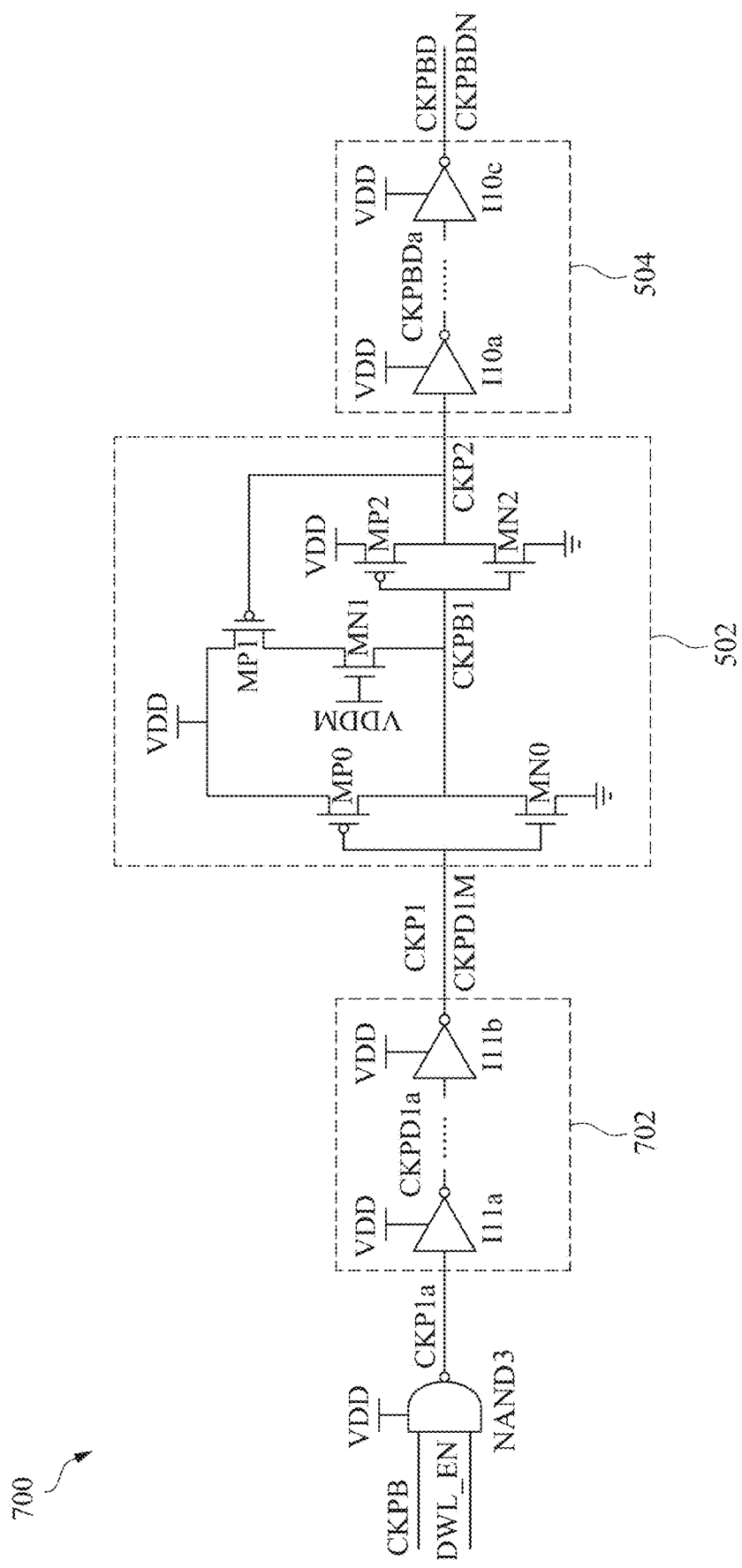
FIG. 7 is a circuit diagram of a circuit, in accordance with some embodiments.
Figure 8:
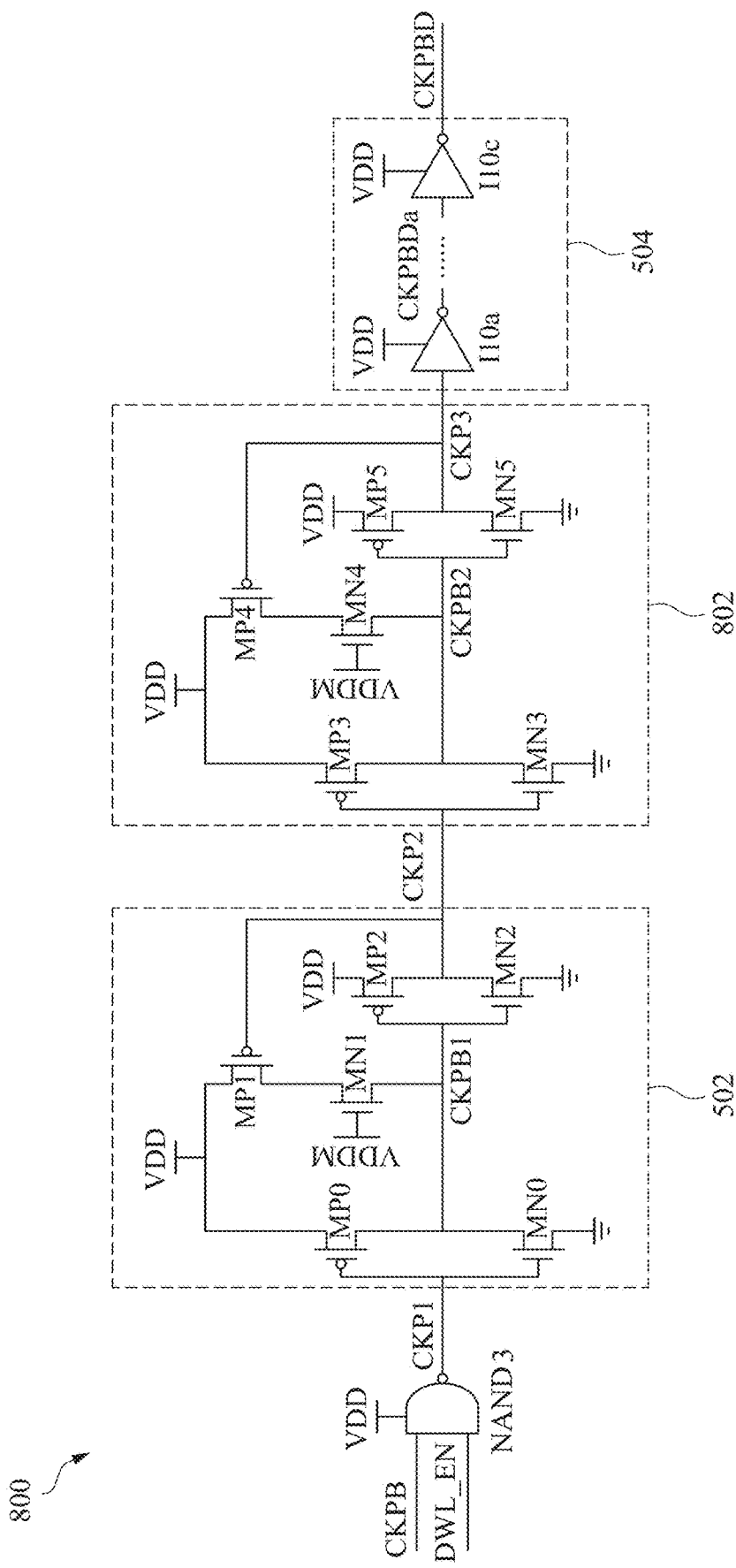
FIG. 8 is a circuit diagram of a circuit, in accordance with some embodiments.
Figure 9:
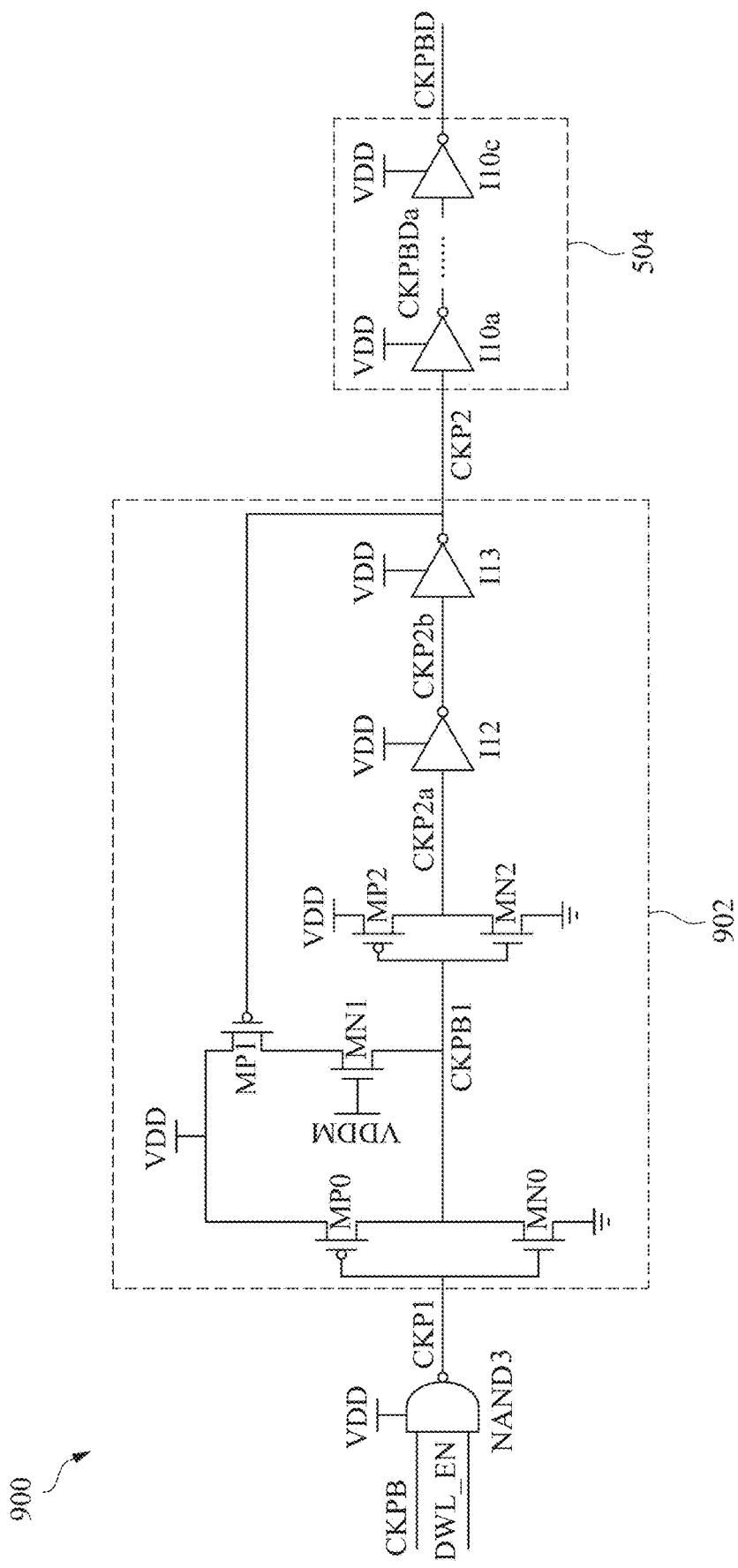
FIG. 9 is a circuit diagram of a circuit, in accordance with some embodiments.

FIG. 6 is a timing diagram 600 of waveforms of a circuit, such as circuit 500 in FIG. 5, circuit 700 in FIG. 7, circuit 800 in FIG. 8 or circuit 900 in FIG. 9, in accordance with some embodiments.

In some embodiments, FIG. 6 is a timing diagram 600 of at least WL adaptive delay circuit 230, in accordance with some embodiments. In some embodiments, FIG. 6 is a timing diagram 600 of at least memory circuit 100, in accordance with some embodiments.

In some embodiments, one or more read operations or write operations are applied to at least one memory cell in a single column of memory cell array 206b in at least memory circuit 200 of FIG. 2, and timing diagram 600 corresponds to waveforms during the one or more read operations or write operations of the at least one memory cell in the single column of memory cell array 206b in at least memory circuit 200 of FIG. 2.

In some embodiments, one or more read operations or write operations of the memory banks in at least memory circuit 100 of FIG. 1 are applied to at least one of memory partition 102A, 102B, 102C or 102D, and timing diagram 600 corresponds to waveforms during the read operations or write operations of at least one of memory partition 102A, 102B, 102C or 102D.

Timing diagram 300 includes waveforms of the clock signal CKP1, the clock signal CKPB1 and the clock signal CKP2.

Timing diagram 600 includes curves 602a, 602b, 602c and 602d of the clock signal CKPB1, and curves 604a, 604b, 604c and 604d of the clock signal CKP2.

In some embodiments, curve 602a represents the clock signal CKPB1 when the supply voltage VDDM of the second supply voltage is equal to a voltage V1, curve 602b represents the clock signal CKPB1 when the supply voltage VDDM of the second supply voltage is equal to a voltage V2, curve 602c represents the clock signal CKPB1 when the supply voltage VDDM of the second supply voltage is equal to a voltage V3, and curve 602d represents the clock signal CKPB1 when the supply voltage VDDM of the second supply voltage is equal to a voltage V4.

In some embodiments, the voltage V4 is greater than the voltage V3, the voltage V3 is greater than the voltage V2, and the voltage V2 is greater than the voltage V1.

In some embodiments, curve 604a represents the clock signal CKP2 when the supply voltage VDDM of the second supply voltage is equal to the voltage V1, curve 604b represents the clock signal CKP2 when the supply voltage VDDM of the second supply voltage is equal to the voltage V2, curve 604c represents the clock signal CKP2 when the supply voltage VDDM of the second supply voltage is equal to the voltage V3, and curve 604d represents the clock signal CKP2 when the supply voltage VDDM of the second supply voltage is equal to the voltage V4.

Prior to time T1, the clock signal CKP1 is logically low, the clock signal CKPB1 (curves 602a, 602b, 602c and 602d) is logically high, and the clock signal CKP2 (604a, 604b, 604c and 604d) is logically low. For example, prior to time T1, the clock signal CKP1 is logically low which causes PMOS transistor MP0 to be turned on, and pulling a node ND5-1 towards the first voltage of the voltage supply VDD, thereby keeping curves 602a, 602b, 602c and 602d to be logically high. Prior to time T1, in response to curves 602a, 602b, 602c and 602d being logically high, NMOS transistor MN2 is turned on, and curves 604a, 604b, 604c and 604d are logically low. In response to curves 604a, 604b, 604c and 604d being logically low, PMOS transistor MP1 is turned on, thereby coupling the drain of NMOS transistor MN1 to the voltage supply VDD. In some embodiments, prior to time T1, since PMOS transistor MP0 is turned on thereby setting the voltage of node N5-1 at the first voltage of the voltage supply VDD, and since the second voltage (V1, V2, V3, V4) of voltage supply VDDM is greater than the first voltage of voltage supply VDD, then the $V_{GS}$ of NMOS transistor MN1 is greater than a threshold voltage of NMOS transistor MN1, and thus NMOS transistor MN1 is slightly turned on.

In some embodiments, prior to time T1, the clock signal CKPB is logically high (as shown in FIG. 3 at time T0), the clock signal CKP1 is logically low and the enable signal DWL_EN is logically high. In some embodiments, the circuit 500 is enabled by the enable signal DWL_EN being logically high. In some embodiments, after time T1, the enable signal DWL_EN is logically high thereby causing the circuit 500 to be enabled. In some embodiments, prior to time T1, the enable signal DWL_EN is logically low thereby causing the circuit 500 to be disabled.

In some embodiments, at time T1, the clock signal CKP1 is logically low and the enable signal DWL_EN transitions to logically high, thereby enabling circuit 500.

At time T1, the clock signal CKP1 transitions from logically low to logically high. In some embodiments, at time T1, the clock signal CKP1 transitions from logically low to logically high in response to a transition of the clock signal CKPB from logically high to logically low as shown at time T1 in FIG. 3.

At time T2a, in response to at least the transition from logically low to logically high of the clock signal CKP1, NMOS transistor MN0 begins to turn on and PMOS transistor MP0 to begin to turn off. As NMOS transistor MN0 begins to turn on, NMOS transistor MN0 attempts to pull node N5-1 towards the reference supply voltage VSS thereby causing curves 602a, 602b, 602c and 602d to begin to transition from logically high to logically low.

At time T2b, the clock signal CKP1 is logically high. At time T2b, curves 602a, 602b, 602c and 602d are between logically high and logically low.

In some embodiments, at time T2b, because the second voltage (V1, V2, V3, V4) of voltage supply VDDM is greater than the first voltage of voltage supply VDD, and curves 602a, 602b, 602c and 602d are between logically high and logically low, then the $V_{GS}$ of NMOS transistor MN1 increases, and is even greater than the threshold voltage of NMOS transistor MN1, and thus causes NMOS transistor MN1 to turn on more than prior to time T2b. In some embodiments, at time T2b, even though NMOS transistor MN0 is turned on, NMOS transistor MN0 cannot fully pull node N5-1 towards the reference supply voltage VSS since NMOS transistor MN1 is also turned on, and is pulling node N5-1 towards the first supply voltage VDD. Thus, NMOS transistor MN1 delays transition of the clock signal CKPB1 (e.g., curves 602a, 602b, 602c or 602d) from logically high to logically low, thereby delaying transition of the clock signal CKP2 (e.g., curves 604a, 604b, 604c or 604d) from logically low to logically high. Stated differently, a difference or gap between the second voltage (V1, V2, V3, V4) of voltage supply VDDM and the first voltage of voltage supply VDD causes NMOS transistor MN1 to turn on, and thereby delay transitions of the clock signal CKP2 (e.g., curves 604a, 604b, 604c or 604d), thereby causing a delay in transitions of the clock signal CKPBD.

At time T2c, curve 602a is sufficiently low enough to thereby cause curve 604a to begin to transition from logically low to logically high. For example, at time T2c, curve 602a is sufficiently low enough to thereby cause NMOS transistor MN2 to begin to turn off and PMOS transistor MP2 to begin to turn on. In response to NMOS transistor MN2 beginning to turn off and PMOS transistor MP2 beginning to turn on, PMOS transistor MP2 begins to pull a node N5-2 towards the first supply voltage VDD, thereby causing curve 604a to begin to transition from logically low to logically high.

At time T2c, in response to curve 604a beginning to transition from logically low to logically high causes PMOS transistor MP1 to begin to turn off, thereby decoupling the drain of NMOS transistor from the first voltage supply. In some embodiments, by decoupling the drain of NMOS transistor from the first voltage supply, and since NMOS transistor MN0 is turned on, NMOS transistor MN0 no longer competes with NMOS transistor MN1, and NMOS transistor MN0 is able to cause curve 602a to further transition to logically low.

At time T3, curve 602a is logically low and curve 604a is almost logically high.

At time T3, curve 602b is sufficiently low enough to thereby cause curve 604b to begin to transition from logically low to logically high. At time T3, operation of circuit 502 for curve 602b and curve 604b is the same as corresponding curve 602a and curve 604a at time T2c, and similar detailed description is therefore omitted.

At time T4, curve 602b is logically low, and curves 604a and 604b are logically high.

At time T5, curve 602c is sufficiently low enough to thereby cause curve 604c to begin to transition from logically low to logically high. At time T5, operation of circuit 502 for curve 602c and curve 604c is the same as corresponding curve 602a and curve 604a at time T2c, and similar detailed description is therefore omitted.

At time T6, curve 602d is sufficiently low enough to thereby cause curve 604d to begin to transition from logically low to logically high. At time T6, operation of circuit 502 for curve 602d and curve 604d is the same as corresponding curve 602a and curve 604a at time T2c, and similar detailed description is therefore omitted.

At time T7, curve 602c and curve 602d are logically low, curve 604c is logically high, and curve 604a is almost logically high.

At time T8, curve 604a is logically high.

As shown in FIG. 6, curve 602b is delayed with respect to curve 602a, curve 602c is delayed with respect to curve 602b, and 602d is delayed with respect to curve 602c. In some embodiments, an amount of delay in curve 602b, 602c or 602d with respect to curve 602a can be adjusted by at least NMOS transistor MN1 by corresponding voltage V2, V3 or V4.

As shown in FIG. 6, curve 604b is delayed with respect to curve 604a, curve 604c is delayed with respect to curve 604b, and 604d is delayed with respect to curve 604c. In some embodiments, an amount of delay in curve 604b, 604c or 604d with respect to curve 604a can be adjusted by at least NMOS transistor MN1 by corresponding voltage V2, V3 or V4.

A difference or gap between the second voltage (V1, V2, V3, V4) of voltage supply VDDM and the first voltage of voltage supply VDD causes the delay in transitions of the clock signal CKPB1 (e.g., curves 602a, 602b, 602c or 602d) and CKP2 (e.g., curves 604a, 604b, 604c or 604d), thereby causing a delay in transitions of the clock signal CKPBD (shown in FIG. 3). In some embodiments, the difference or gap between the second voltage (V1, V2, V3, V4) of voltage supply VDDM and the first voltage of voltage supply VDD causes NMOS transistor MN1 to turn on, and thereby delay transitions of the clock signal CKP2 (e.g., curves 604a, 604b, 604c or 604d), thereby causing a delay in transitions of the clock signal CKPBD.

In some embodiments, as the difference or gap between the second voltage (V1, V2, V3, V4) of voltage supply VDDM and the first voltage of voltage supply VDD increases, then the amount of delay in the clock signal CKPB1 (e.g., curves 602a, 602b, 602c or 602d) transitioning from logically high to logically low increases, and the amount of delay in the clock signal CKP2 (e.g., curves 604a, 604b, 604c or 604d) transitioning from logically low to logically high increases.

In some embodiments, as the difference or gap between the second voltage (V1, V2, V3, V4) of voltage supply VDDM and the first voltage of voltage supply VDD decreases, then the amount of delay in the clock signal CKPB1 (e.g., curves 602a, 602b, 602c or 602d) transitioning from logically high to logically low increases, and the amount of delay in the clock signal CKP2 (e.g., curves 604a, 604b, 604c or 604d) transitioning from logically low to logically high decreases.

In some embodiments, circuit 500 is able to be utilized in a dual rail power scheme, and by using circuit 500 and waveform 600 the rising edge and the falling edge of the word line signal WL are delayed by at least the clock signal CKPBD, and therefore circuit 500 does not suffer from degradation of write margin because the pulse width of the word line signal WL is not reduced compared to other approaches.

In some embodiments, circuit 500 is able to be utilized in a dual rail power scheme, and increases in the VDDM-VDD gap from dual rail power schemes does not cause early read issues because increases in the VDDM-VDD gap in circuit 500 also causes increases in the delay of at least the clock signal CKPBD thereby causing the word line signal WL to be delayed with respect to the clock signal CKP_WY compared to other approaches.

In some embodiments, by operating circuit 500, waveform 600 causes at least one of circuit 500, 700, 800 or 900 to achieve one or more benefits described herein.

In some embodiments, while timing diagram 600 is described with respect to circuit 500, timing diagram 600 is also applicable to one or more of circuits 700, 800 or 900 in a similar manner, and is not described for brevity.

Other configurations of timing diagram 600 are within the scope of the present disclosure.

Circuit:

FIG. 7 is a circuit diagram of a circuit 700, in accordance with some embodiments.

Circuit 700 is a variation of circuit 500 of FIG. 5, and similar detailed description is therefore omitted. For example, circuit 700 illustrates a non-limiting example where an additional delay chain circuit 702 is included in circuit 700 in comparison with circuit 500 of FIG. 5, and similar detailed description is therefore omitted.

Circuit 700 is an embodiment of the WL adaptive delay circuit 230 of FIGS. 2 and 4, and similar detailed description is therefore omitted.

Circuit 700 includes NAND logic gate NAND3, delay chain circuit 702, circuit 502 and delay chain circuit 504.

In comparison with circuit 500 of FIG. 5, delay chain circuit 702 of FIG. 7 is between NAND logic gate NAND3 and circuit 502, and similar detailed description is therefore omitted.

Delay chain circuit 702 is configured to generate a clock signal CKP1 in response to the clock signal CKP1a. In some embodiments, the clock signal CKP1 is a delayed version of the clock signal CKP1a. Delay chain circuit 702 is coupled to the first voltage supply having the supply voltage VDD.

Delay chain circuit 702 has M stages (collectively referred to as "a set of stages" (not labelled)), where M is an integer corresponding to the number of stages and inverters I11a, I11b, ..., I11M in delay chain circuit 702. Each stage of the set of stages is configured to generate a corresponding clock signal CKPD1a, CKPD1b, ..., CKPD1M. In some embodiments, clock signal CKPD1M is the clock signal CKP1. The number of stages M of the set of stages (not labelled) is even. A number of clock signals CKPD1a, CKPD1b, ..., CKPD1M is even, and is equal to integer M. Other numbers of stages M or clock signals CKPD1a, CKPD1b, ..., CKPD1M are within the scope of the present disclosure.

Delay chain circuit 702 includes M inverters I11a, I11b, ..., I11M (collectively referred to as "a set of inverters I11") coupled together in series. The set of inverters I11 is coupled to the first voltage supply having the supply voltage VDD.

In some embodiments, each inverter of the set of inverters I11 corresponds to a stage M of the set of stages (not labelled). A number of inverters of the set of inverters I11 is even. Each inverter of the set of inverters I11 is configured to generate a corresponding clock signal CKPD1a, CKPD1b, ..., CKPD1M. In some embodiments, the Mth inverter of the set of inverters I11 is configured to generate a corresponding clock signal CKPD1M that is the clock signal CKP1.

Each inverter I11a, I11b, ..., I11M of the set of inverters is configured to invert the clock signal (e.g., CKP1a, CKPD1a, ..., CKPD1M−1) received on the corresponding input terminal thereby generating an inverted clock signal (e.g., CKPD1a, CKPD1b, ..., CKPD1M), and to output the inverted clock signal (e.g., CKPD1a, CKPD1b, ..., CKPD1M) on the corresponding output terminal.

An input terminal of inverter I11a is coupled to the output terminal of NAND logic gate NAND3. The input terminal of inverter I11a is configured to receive the clock signal CKP1a. In some embodiments, the clock signal CKP1a of FIG. 7 is clock signal CKP1 of FIG. 5, and similar detailed description is therefore omitted. An output terminal of inverter I11a is coupled to an input terminal of inverter I11b. An output terminal of inverter I11b is coupled to an input terminal of inverter I11M−1. An output terminal of inverter I11M−1 is coupled to an input terminal of inverter I11M. The output terminal of inverter I11M is coupled to the gate of PMOS transistor MP0 and the gate of NMOS transistor MN0.

Other configurations, other types of circuit elements or other numbers of circuit elements in at least one of circuit 502, delay chain circuit 702, delay chain circuit 504 or circuit 700 are within the scope of the present disclosure.

In some embodiments, circuit 700 operates to achieve one or more benefits described herein.

Other configurations of circuit 700 are within the scope of the present disclosure. In some embodiments, operation of circuit 700 is the same as the operation of circuit 500, and therefore the timing diagram 600 of FIG. 6 is also applicable to circuit 700 and is not described for brevity.

FIG. 8 is a circuit diagram of a circuit 800, in accordance with some embodiments.

Circuit 800 is a variation of circuit 500 of FIG. 5, and similar detailed description is therefore omitted. For example, circuit 800 illustrates a non-limiting example where an additional circuit 802 is included in circuit 800 in comparison with circuit 500 of FIG. 5, and similar detailed description is therefore omitted.

Circuit 800 is an embodiment of the WL adaptive delay circuit 230 of FIGS. 2 and 4, and similar detailed description is therefore omitted.

Circuit 800 includes NAND logic gate NAND3, circuit 502, circuit 802 and delay chain circuit 504.

In comparison with circuit 500 of FIG. 5, circuit 802 of FIG. 8 is between circuit 502 and delay chain circuit 504, and similar detailed description is therefore omitted.

Circuit 802 is a variation of circuit 502 of FIG. 5, and similar detailed description is therefore omitted. In some embodiments, operation of circuit 802 is similar to circuit 502, and similar detailed description is therefore omitted.

Circuit 802 includes a PMOS transistor MP3, a PMOS transistor MP4, a PMOS transistor MP5, an NMOS transistor MN3, an NMOS transistor MN4, and an NMOS transistor MN5. PMOS transistor MP3, PMOS transistor MP4, PMOS transistor MP5, NMOS transistor MN3, NMOS transistor MN4, and NMOS transistor MN5 are part of circuit 802.

In comparison with circuit 502 of FIG. 5, PMOS transistor MP3 is similar to PMOS transistor MP0, PMOS transistor MP4 is similar to PMOS transistor MP1, PMOS transistor MP5 is similar to PMOS transistor MP2, NMOS transistor MN3 is similar to NMOS transistor MN0, NMOS transistor MN4 is similar to NMOS transistor MN1, and NMOS transistor MN5 is similar to NMOS transistor MN2, and similar detailed description is therefore omitted.

PMOS transistor MP3 and NMOS transistor MN3 are configured as an inverter (not labelled) and are configured to generate the clock signal CKPB2 in response to the clock signal CKP2. In some embodiments, the clock signal CKPB2 is inverted from the clock signal CKP2.

A source of PMOS transistor MP3 is coupled to the first voltage supply having the supply voltage VDD. A source of NMOS transistor MN3 is coupled to a reference voltage supply VSS.

In comparison with FIG. 5, each of a gate of PMOS transistor MP3, a gate of NMOS transistor MN3, the gate of PMOS transistor MP2, the gate of NMOS transistor MN2 and the gate of PMOS transistor MP1 are coupled together.

Each of the gate of PMOS transistor MP3 and the gate of NMOS transistor MN3 are configured to receive the clock signal CKP2 from the PMOS transistor MP3 and the NMOS transistor MN3.

Each of a drain of PMOS transistor MP3, a drain of NMOS transistor MN3, a source of NMOS transistor MN4, a gate of PMOS transistor MP5 and a gate of NMOS transistor MN5 are coupled together.

A source of PMOS transistor MP4 is coupled to the first voltage supply having the supply voltage VDD.

Each of a gate of PMOS transistor MP4, a drain of PMOS transistor MP5, a drain of NMOS transistor MN5 and the input terminal of inverter I10a of the delay chain circuit 504 are coupled together. The gate of PMOS transistor MP4 is configured to receive a clock signal CKP2 from the drain of PMOS transistor MP5 and the drain of NMOS transistor MN5.

A drain of PMOS transistor MP4 and a drain of NMOS transistor MN4 are coupled together.

A gate of NMOS transistor MN4 is coupled to the second voltage supply having the supply voltage VDDM. The gate of NMOS transistor MN4 is configured to receive the supply voltage VDDM from the second voltage supply.

In some embodiments, the effect of the gate of NMOS transistor MN4 being configured to receive the supply voltage VDDM from the second voltage supply is similar to the effect of the gate of NMOS transistor MN1 being configured to receive the supply voltage VDDM from the second voltage supply, and similar detailed description is therefore omitted. In some embodiments, adding an additional circuit 802 to circuit 800, causes circuit 800 to generate the clock signal CKPBD with additional tuning delay values than other approaches.

In some embodiments, at least one of PMOS transistor MP4 or NMOS transistor MN4 is configured to adjust or set the clock signal CKPB2.

PMOS transistor MP5 and NMOS transistor MN5 are configured as an inverter (not labelled) and are configured to generate the clock signal CKP3 in response to the clock signal CKPB2. In some embodiments, the clock signal CKP3 is inverted from the clock signal CKPB2.

A source of PMOS transistor MP5 is coupled to the first voltage supply having the supply voltage VDD. A source of NMOS transistor MN5 is coupled to the reference voltage supply VSS.

Each of a gate of PMOS transistor MP5 and a gate of NMOS transistor MN5 are coupled together and are configured to receive the clock signal CKPB2.

Each of a drain of PMOS transistor MP5 and a drain of NMOS transistor MN5 are coupled together and configured to output the clock signal CKP3 to the input terminal of inverter I10a. The clock signal CKP3 is sent to the gate of PMOS transistor MP4 as part of a feed-back loop.

The input terminal of inverter I10a of FIG. 8 is configured to receive the clock signal CKP3. In comparison with inverter I10a of FIG. 5, the clock signal CKP3 of FIG. 8 replaces the clock signal CKP2 at the input terminal of inverter I10a of FIG. 5, and similar detailed description is therefore omitted. Thus, delay chain circuit 504 in FIG. 8 is configured to generate the clock signal CKPBD in response to the clock signal CKP3. In some embodiments, the clock signal CKPBD is an inverted and a delayed version of the clock signal CKP3.

Other configurations, other types of circuit elements or other numbers of circuit elements in at least one of circuit 502, circuit 802, delay chain circuit 504 or circuit 800 are within the scope of the present disclosure.

In some embodiments, circuit 800 operates to achieve one or more benefits described herein.

Other configurations of circuit 800 are within the scope of the present disclosure. In some embodiments, operation of circuit 800 is the same as the operation of circuit 500, and therefore the timing diagram 600 of FIG. 6 is also applicable to circuit 800 and is not described for brevity. FIG. 9 is a circuit diagram of a circuit 900, in accordance with some embodiments.

Circuit 900 is a variation of circuit 500 of FIG. 5, and similar detailed description is therefore omitted. For example, circuit 900 illustrates a non-limiting example where circuit 902 includes additional inverters (e.g., inverters I12 and I13) in comparison with circuit 502 of FIG. 5, and similar detailed description is therefore omitted. In some embodiments, adding inverters (e.g., inverters I12 and I13) to circuit 900, causes circuit 900 to generate the clock signal CKPBD with additional tuning delay values than other approaches.

Circuit 900 includes NAND logic gate NAND3, circuit 902 and delay chain circuit 504.

In comparison with circuit 500 of FIG. 5, circuit 902 replaces circuit 502 of FIG. 5, and similar detailed description is therefore omitted.

Circuit 902 is a variation of circuit 502 of FIG. 5, and similar detailed description is therefore omitted. In comparison with circuit 502 of FIG. 5, circuit 902 further includes inverter I12 and inverter I13, and similar detailed description is therefore omitted. In some embodiments, operation of circuit 902 is similar to circuit 502, and similar detailed description is therefore omitted.

In comparison with circuit 502 of FIG. 5, in FIG. 9, each of the gate of PMOS transistor MP1, an output terminal of inverter I13 and the input terminal of inverter I10a of the delay chain circuit 504 are coupled together.

In comparison with circuit 502 of FIG. 5, the gate of PMOS transistor MP1 is configured to receive the clock signal CKP2 from the output terminal of inverter I13, and similar detailed description is therefore omitted. The clock signal CKP2 is sent to the gate of PMOS transistor MP1 as part of a feed-back loop.

In comparison with circuit 502 of FIG. 5, each of the drain of PMOS transistor MP2, the drain of NMOS transistor MN2 and an input terminal of inverter I12 are coupled together in FIG. 9.

In comparison with circuit 502 of FIG. 5, each of the drain of PMOS transistor MP2 and the drain of NMOS transistor MN2 are configured to output the clock signal CKP2a in FIG. 9. In some embodiments, the clock signal CKP2a of FIG. 9 is the clock signal CKP2 at the drain of PMOS transistor MP2 and the drain of NMOS transistor MN2 of FIG. 5, and similar detailed description is therefore omitted. In some embodiments, the clock signal CKP2a is inverted from the clock signal CKPB1.

Inverter I12 is configured to generate a clock signal CKP2b in response to the clock signal CKP2a. In some embodiments, the clock signal CKP2b is inverted from the clock signal CKP2a. An input terminal of inverter I12 is configured to receive the clock signal CKP2a. The input terminal of inverter I12 is coupled to the drain of PMOS transistor MP2 and the drain of NMOS transistor MN2. An output terminal of inverter I12 is coupled to an input terminal of inverter I13, and is configured to output the clock signal CKP2b.

Inverter I13 is configured to generate the clock signal CKP2 in response to the clock signal CKP2b. In some embodiments, the clock signal CKP2 is inverted from the clock signal CKP2b. In some embodiments, the clock signal CKP2 is a delayed version of the clock signal CKP2a. An input terminal of inverter I13 is coupled to the output terminal of inverter I12, and is configured to receive the clock signal CKP2b. An output terminal of inverter I13 is coupled to the input terminal of inverter I10a and the gate of PMOS transistor MP1. The output terminal of inverter I13 is configured to output the clock signal CKP2.

Each of inverter I12 and inverter I13 is coupled to the first voltage supply having the supply voltage VDD.

In comparison with circuit 500 of FIG. 5, the input terminal of inverter I10a of FIG. 9 is configured to receive the clock signal CKP2 from the output terminal of inverter I13.

Other configurations, other types of circuit elements or other numbers of circuit elements in at least one of circuit 902, delay chain circuit 504 or circuit 900 are within the scope of the present disclosure.

In some embodiments, circuit 900 operates to achieve one or more benefits described herein.

Figure 10:
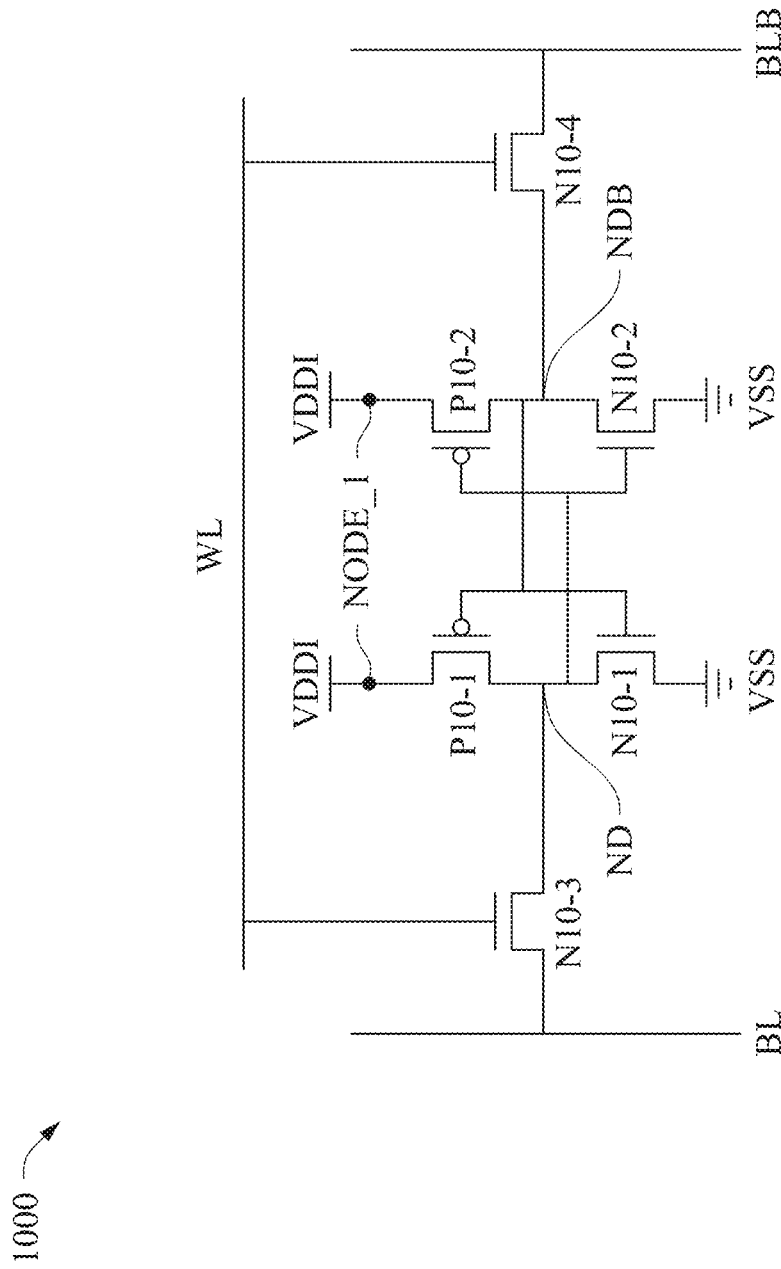
FIG. 10 is a circuit diagram of a memory cell usable in FIGS. 1 and 2, in accordance with some embodiments.

Other configurations of circuit 900 are within the scope of the present disclosure. In some embodiments, operation of circuit 900 is the same as the operation of circuit 500, and therefore the timing diagram 600 of FIG. 6 is also applicable to circuit 900 and is not described for brevity. MEMORY CELL FIG. 10 is a circuit diagram of a memory cell 1000 usable in FIGS. 1 and 2, in accordance with some embodiments.

Memory cell 1000 is usable as one or more memory cells MCB in at least one of memory cell array 110AR of FIG. 1, memory device 112 of FIG. 1, memory cell MCB of FIG. 2 or memory cell array 206b of FIG. 2.

Memory cell 1000 is a six transistor (6T) single port (SP) SRAM memory cell used for illustration. In some embodiments, memory cell 1000 employs a number of transistors other than six. Other types of memory are within the scope of various embodiments.

Memory cell 1000 comprises two PMOS transistors P10-1 and P10-2, and four NMOS transistors N10-1, N10-2, N10-3, and N10-4. Transistors P10-1, P10-2, N10-1, and N10-2 form a cross latch or a pair of cross-coupled inverters. For example, PMOS transistor P10-1 and NMOS transistor N10-1 form a first inverter while PMOS transistor P10-2 and NMOS transistor N10-2 form a second inverter.

A source terminal of each of PMOS transistors P10-1 and P10-2 are configured as a voltage supply node NODE_1. Each voltage supply node NODE_1 is coupled to a first voltage supply VDDI. A drain terminal of PMOS transistor P10-1 is coupled with a drain terminal of NMOS transistor N10-1, a gate terminal of PMOS transistor P10-2, a gate terminal of NMOS transistor N10-2, and a source terminal of NMOS transistor N10-3 and is configured as a storage node ND.

A drain terminal of PMOS transistor P10-2 is coupled with a drain terminal of NMOS transistor N10-2, a gate terminal of PMOS transistor P10-1, a gate terminal of NMOS transistor N10-1, and a source terminal of NMOS transistor N10-4 and is configured as a storage node NDB. A source terminal of each of NMOS transistors N10-1 and N10-2 is configured as a supply reference voltage node (not labelled) having a supply reference voltage VSS. The source terminal of each of NMOS transistors N10-1 and N10-2 is also coupled to reference voltage supply VSS.

A word line WL is coupled with a gate terminal of each of NMOS transistors N10-3 and N10-4. Word line WL is also called a write control line because NMOS transistors N10-3 and N10-4 are configured to be controlled by a signal on word line WL in order to transfer data between bit lines BL, BLB and corresponding nodes ND, NDB.

A drain terminal of NMOS transistor N10-3 is coupled to a bit line BL. A drain terminal of NMOS transistor N10-4 is coupled to a bit line BLB. Bit lines BL and BLB are configured as both data input and output for memory cell 1000. In some embodiments, in a write operation, applying a logical value to a bit line BL and the opposite logical value to the other bit line BLB enables writing the logical values on the bit lines to memory cell 1000. Each of bit lines BL and BLB is called a data line because the data carried on bit lines BL and BLB are written to and read from corresponding nodes ND and NDB.

Word line WL corresponds to one or more word lines WL in FIG. 2.

Other configurations of memory cell 1000 are within the scope of the present disclosure.

Waveforms

Figure 11:
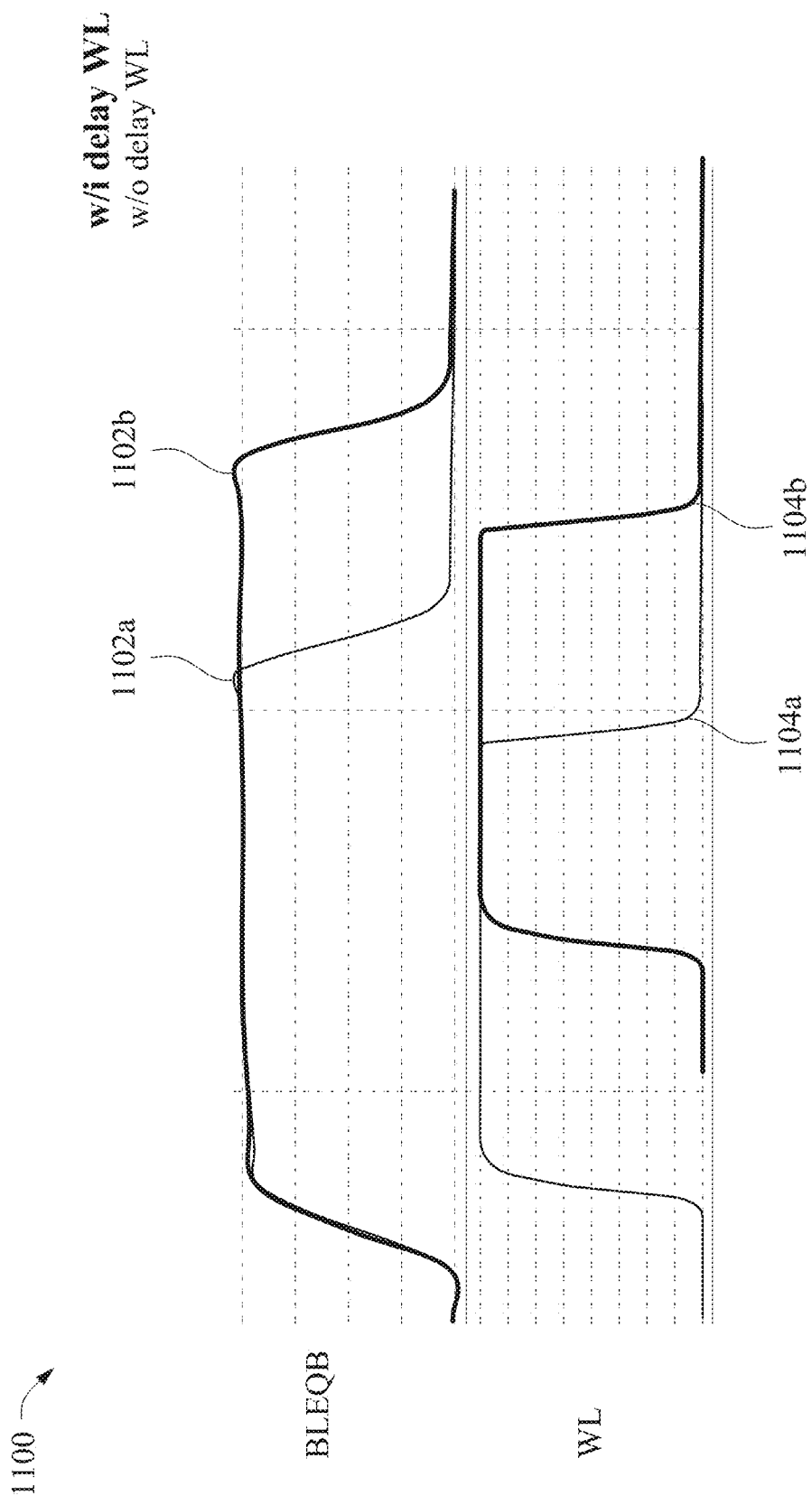
FIG. 11 is a timing diagram of waveforms of a memory circuit, such as the memory circuit in FIG. 2, in accordance with some embodiments.

FIG. 11 is a timing diagram 1100 of waveforms of a memory circuit, such as memory circuit 200 in FIG. 2, in accordance with some embodiments. In some embodiments, FIG. 11 is a timing diagram 1100 of at least circuit 400, circuit 500, circuit 700, circuit 800, or circuit 900, in accordance with some embodiments. In some embodiments, FIG. 11 is a timing diagram 1100 of at least memory circuit 100, in accordance with some embodiments.

In some embodiments, one or more read operations or write operations are applied to at least one memory cell in a single column of memory cell array 206b in at least memory circuit 200 of FIG. 2, and timing diagram 1100 corresponds to waveforms during the one or more read operations or write operations of the at least one memory cell in the single column of memory cell array 206b in at least memory circuit 200 of FIG. 2.

Timing diagram 1100 includes curves 1102a and 1102b of an equalization signal BLEQB and curves 1104a and 1104b of a word line signal WL.

In some embodiments, curve 1102a represents an equalization signal BLEQB that corresponds to the clock equalization signal CKP_BLEQ of FIG. 2 when the WL adaptive delay circuit 230 is disabled, and curve 1102b represents the equalization signal BLEQB that corresponds to the clock equalization signal CKP_BLEQ of FIG. 2 when the WL adaptive delay circuit 230 is enabled.

As shown in FIG. 11, curve 1102b is delayed with respect to curve 1102a. In some embodiments, an amount of delay in curve 1102b with respect to curve 1102a can be adjusted by at least one of WL adaptive delay circuit 230 or circuit 500, 700, 800 or 900.

In some embodiments, curve 1104a represents a word line signal WL of FIG. 2 when the WL adaptive delay circuit 230 is disabled; and curve 1104b represents a word line signal WL of FIG. 2 when the WL adaptive delay circuit 230 is enabled.

As shown in FIG. 11, curve 1104b is delayed with respect to curve 1104a. In some embodiments, an amount of delay in curve 1104b with respect to curve 1104a can be adjusted by at least one of WL adaptive delay circuit 230 or circuit 500, 700, 800 or 900.

In some embodiments, while timing diagram 1100 is described with respect to memory cell array 206b, timing diagram 1100 is also applicable to one or more of memory banks 110L or 110R in a similar manner and is not described for brevity.

Other configurations of timing diagram 1100 are within the scope of the present disclosure.

Figure 12A:
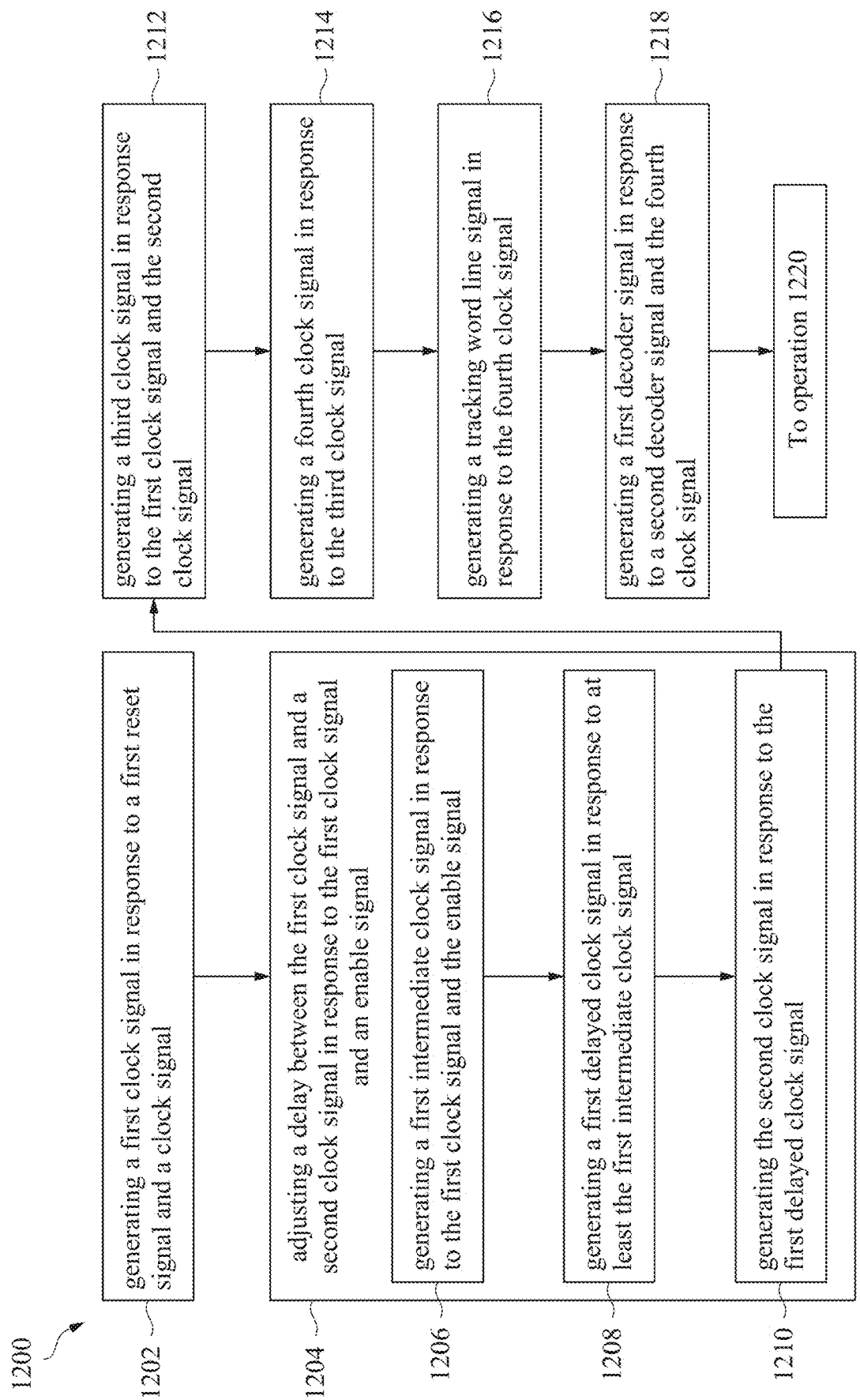
FIGS. 12A-12B are a flowchart of a method of operating a circuit, in accordance with some embodiments.
Figure 12B:
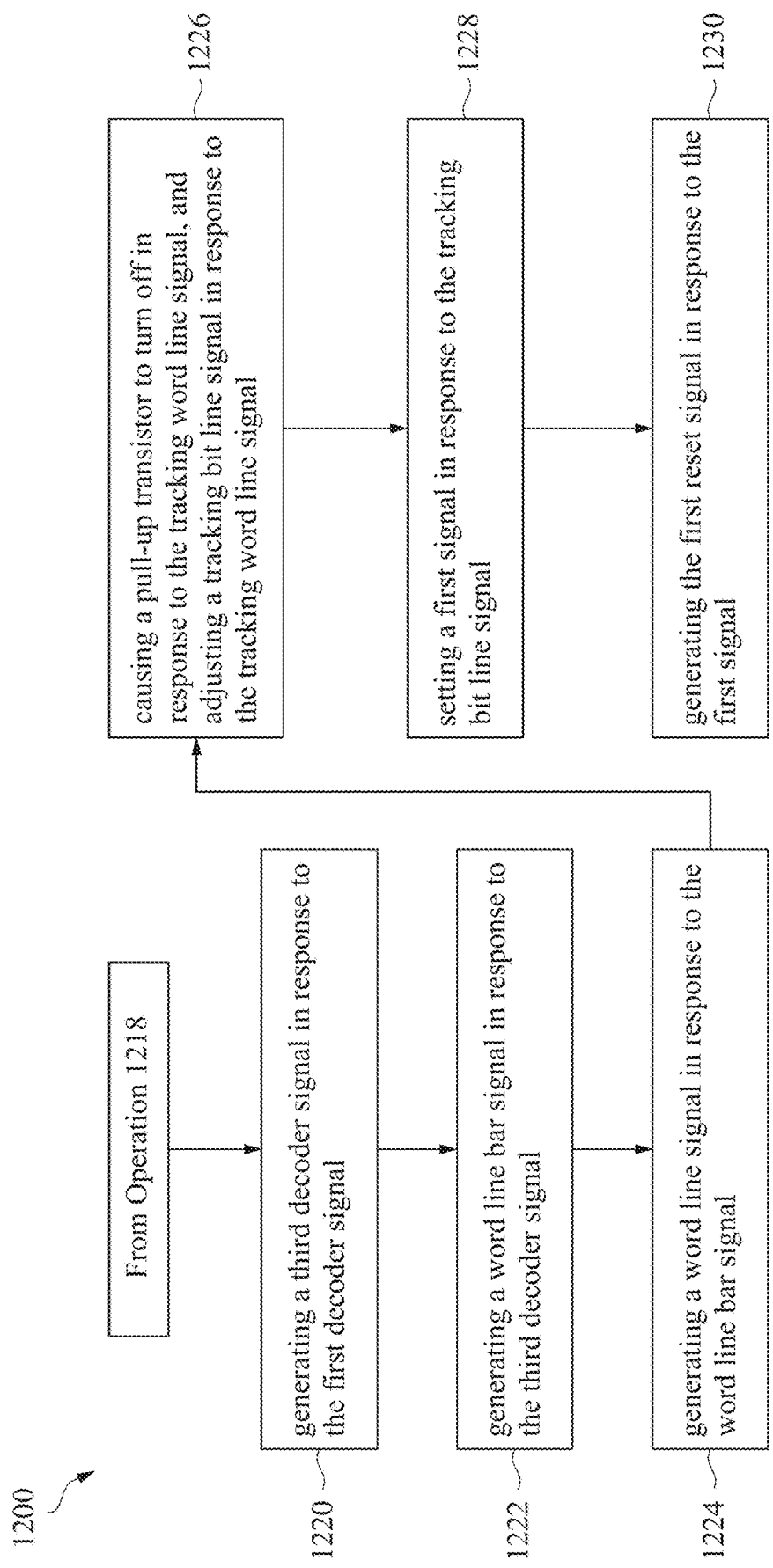

Method:

FIGS. 12A-12B are a flowchart of a method 1200 of operating a circuit, in accordance with some embodiments.

In some embodiments, FIGS. 12A-12B are flowcharts of a method 1200 of operating at least one of memory circuit 100 of FIG. 1, memory circuit 200 of FIG. 2 or memory circuit 400 of FIG. 4, or memory cell 1000 of FIG. 10.

In some embodiments, FIGS. 12A-12B are flowcharts of a method 1200 of operating at least one of circuit 500 of FIG. 5, circuit 700 of FIG. 7, circuit 800 of FIG. 8 or circuit 900 of FIG. 9. In some embodiments, FIGS. 12A-12B are flowcharts of a method 1200 of operating a memory circuit, and the method 1200 includes the features of at least one of timing diagrams 300 of FIG. 3, timing diagram 600 of FIG. 6 or timing diagram 1100 of FIG. 11, and similar detailed description is omitted for brevity.

It is understood that additional operations may be performed before, during, and/or after the method 1200 depicted in FIGS. 12A-12B, and that some other operations may only be briefly described herein. It is understood that method 1200 utilizes features of at least one of memory circuit 100 of FIG. 1, memory circuit 200 of FIG. 2, memory circuit 400 of FIG. 4, circuit 500 of FIG. 5, circuit 700 of FIG. 7, circuit 800 of FIG. 8, circuit 900 of FIG. 9 or memory cell 1000 of FIG. 10, and similar detailed description is omitted for brevity.

In some embodiments, other order of operations of method 1200 is within the scope of the present disclosure. Method 1200 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1200 is not performed.

In operation 1202 of method 1200, a first clock signal is generated in response to a first reset signal and a clock signal.

In some embodiments, operation 1202 is performed by a first clock circuit. In some embodiments, the first clock circuit of method 1200 includes clock generating circuit 222.

In some embodiments, the first clock signal of method 1200 includes clock signal CKPB. In some embodiments, the first reset signal of method 1200 includes signal RSC. In some embodiments, the clock signal of method 1200 includes clock signal CLK.

In operation 1204 of method 1200, a delay between the first clock signal and a second clock signal is adjusted in response to the first clock signal and an enable signal.

In some embodiments, operation 1204 is performed by an adjustable delay circuit. In some embodiments, the adjustable delay circuit of method 1200 includes WL adaptive delay circuit 230 or circuit 500, 700, 800 or 900.

In some embodiments, the second clock signal of method 1200 includes clock signal CKPBD. In some embodiments, the enable signal of method 1200 includes enable signal DWL_EN.

In some embodiments, operation 1204 comprises generating the second clock signal in response to the first clock signal and the enable signal.

In some embodiments, operation 1204 comprises at least one of operation 1206, 1208 or 1210.

In operation 1206 of method 1200, a first intermediate clock signal is generated in response to the first clock signal and the enable signal.

In some embodiments, operation 1206 is performed by a first NAND logic gate. In some embodiments, the first NAND logic gate of method 1200 includes at least NAND logic gate NAND3.

In some embodiments, the first intermediate clock signal of method 1200 includes at least one of clock signal CKP1 or CKP1a.

In operation 1208 of method 1200, a first delayed clock signal is generated in response to at least the first intermediate clock signal.

In some embodiments, operation 1208 is performed by at least one of a first delay circuit or a second delay circuit. In some embodiments, the first delay circuit of method 1200 includes at least one of circuit 502 or 902. In some embodiments, the second delay circuit of method 1200 includes at least one of delay chain circuit 702 or circuit 802.

In some embodiments, the first delayed clock signal of method 1200 includes clock signal CKP2.

In operation 1210 of method 1200, the second clock signal is generated in response to the first delayed clock signal.

In some embodiments, operation 1210 is performed by at least one of a third delay circuit. In some embodiments, the third delay circuit of method 1200 includes at least one of delay chain circuit 504. In some embodiments, the second clock signal is delayed and inverted with respect to the first delayed clock signal.

In operation 1212 of method 1200, a third clock signal is generated in response to the first clock signal and the second clock signal.

In some embodiments, operation 1212 is performed by a first circuit. In some embodiments, the first circuit of method 1200 includes at least NOR logic gate NOR1 and inverter I5. In some embodiments, the first circuit of method 1200 includes at least NAND logic gate NAND2 and inverters I8 and I9.

In some embodiments, the third clock signal of method 1200 includes at least one of clock signal CK2 or CK2a.

In operation 1214 of method 1200, a fourth clock signal is generated in response to the third clock signal.

In some embodiments, operation 1214 is performed by a first inverter. In some embodiments, the first inverter of method 1200 includes at least inverter I6.

In some embodiments, the fourth clock signal of method 1200 includes at least one of clock signal CKP_WL.

In operation 1216 of method 1200, a tracking word line signal is generated in response to the fourth clock signal.

In some embodiments, operation 1216 is performed by a pair of inverters. In some embodiments, the pair of inverters of method 1200 includes at least inverters I1 and I2.

In some embodiments, the tracking word line signal of method 1200 includes tracking word line signal TRKWL.

In operation 1218 of method 1200, a first decoder signal is generated in response to a second decoder signal and the fourth clock signal.

In some embodiments, operation 1218 is performed by a first NAND logic gate. In some embodiments, the first NAND logic gate of method 1200 includes NAND logic gate NAND1.

In some embodiments, the first decoder signal of method 1200 includes decoder signal ND1. In some embodiments, the second decoder signal of method 1200 includes decoder signal pdec_x.

In operation 1220 of method 1200, a third decoder signal is generated in response to the first decoder signal.

In some embodiments, operation 1220 is performed by a second inverter. In some embodiments, the second inverter of method 1200 includes second inverter I7.

In some embodiments, the third decoder signal of method 1200 includes decoder signal DEC_X.

In operation 1222 of method 1200, a word line bar signal WLB is generated in response to the third decoder signal.

In some embodiments, operation 1222 is performed by a word line post-decoder circuit. In some embodiments, the word line post-decoder circuit of method 1200 includes post-decoder circuit 240.

In operation 1224 of method 1200, a word line signal WL is generated in response to the word line bar signal.

In some embodiments, operation 1224 is performed by a third inverter. In some embodiments, the third inverter of method 1200 includes NMOS transistor N6 and PMOS transistor P6.

In operation 1226 of method 1200, a pull-up transistor is turned off in response to the tracking word line signal TRKWL, and a tracking bit line signal TRKBL is adjusted by a set of tracking cells in response to the tracking word line signal TRKWL.

In some embodiments, the pull-up transistor of method 1200 includes PMOS transistor P1. In some embodiments, the set of tracking cells of method 1200 includes tracking cells 206a.

In some embodiments, operation 1226 includes turning on the pull-up transistor in response to the tracking word line signal TRKWL thereby adjusting the tracking bit line signal TRKBL in response to the tracking word line signal TRKWL, and turning off the set of tracking cells in response to the tracking word line signal TRKWL.

In operation 1228 of method 1200, a first signal is set in response to the tracking bit line signal.

In some embodiments, operation 1228 is performed by at least a first P-type transistor or a first N-type transistor. In some embodiments, the first P-type transistor includes at least one of PMOS transistor P4, P2 or P3. In some embodiments, the first N-type transistor includes NMOS transistor N5.

In some embodiments, the first signal of method 1200 includes signal TRKBL1B.

In operation 1230 of method 1200, the first reset signal is generated in response to the first signal.

In some embodiments, operation 1230 is performed by delay circuit 220.

By operating method 1200, at least one of memory circuit 100 of FIG. 1, memory circuit 200 of FIG. 2 or memory circuit 400 of FIG. 4 operate to achieve the benefits discussed herein.

In some embodiments, one or more of the operations of method 1200 is not performed. Furthermore, various PMOS or NMOS transistors shown in FIGS. 2, 4-5 and 7-10 are of a particular dopant type (e.g., N-type or P-type) for illustration purposes. Embodiments of the disclosure are not limited to a particular transistor type, and one or more of the PMOS or NMOS transistors shown in FIGS. 2, 4-5 and 7-10 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in FIGS. 2, 4-5 and 7-10 is within the scope of various embodiments. Selecting different numbers of transistors in FIGS. 2, 4-5 and 7-10 is within the scope of various embodiments. Selecting different numbers of NAND or NOR logic gates in FIGS. 2, 4-5 and 7-10 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a word line driver circuit coupled to a word line, and a control circuit coupled to the word line driver circuit. In some embodiments, the control circuit is configured to delay a leading edge or a falling edge of a word line signal in response to at least a first clock signal. In some embodiments, the control circuit includes a first clock circuit configured to generate a second clock signal in response to a first reset signal and a clock signal, and an adjustable delay circuit configured to adjust a delay between the second clock signal and a third clock signal in response to the second clock signal and an enable signal. In some embodiments, the third clock signal being a delayed version of the second clock signal. In some embodiments, an amount of the delay between the second clock signal and the third clock signal is based on a voltage difference between a first supply voltage having a first swing, and a second supply voltage having a second swing.

Another aspect of this description relates to a memory circuit. The memory circuit includes a memory cell array including a set of memory cells and a set of tracking cells, a word line driver circuit coupled to the memory cell array, and a control circuit coupled to the word line driver circuit and configured to delay a leading edge or a falling edge of a word line signal in response to at least a first clock signal. In some embodiments, the control circuit includes a first clock circuit configured to generate a second clock signal in response to a first reset signal and a clock signal, and an adjustable delay circuit configured to adjust a delay between the second clock signal and a third clock signal in response to the second clock signal and an enable signal. In some embodiments, the third clock signal is a delayed version of the second clock signal. In some embodiments, an amount of the delay between the second clock signal and the third clock signal is based on a voltage difference between a first supply voltage having a first swing, and a second supply voltage having a second swing.

Still another aspect of this description relates to a method of operating a memory circuit. The method includes generating, by a first clock circuit, a first clock signal in response to a first reset signal and a clock signal. In some embodiments, the method further includes adjusting, by an adjustable delay circuit, a delay between the first clock signal and a second clock signal in response to the first clock signal and an enable signal, the second clock signal being a delayed version of the first clock signal, wherein an amount of the delay between the first clock signal and the second clock signal is based on a voltage difference between a first supply voltage having a first swing, and a second supply voltage having a second swing. In some embodiments, the method further includes generating, by a first circuit, a third clock signal in response to the first clock signal and the second clock signal. In some embodiments, the method further includes generating, by a first inverter, a fourth clock signal, in response to the third clock signal, the fourth clock signal being inverted from the third clock signal. In some embodiments, the method further includes generating, by a pair of inverters, a tracking word line signal in response to the fourth clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a word line driver circuit coupled to a word line; and
   a control circuit coupled to the word line driver circuit, and configured to delay a leading edge or a falling edge of a word line signal in response to at least a first clock signal, the control circuit comprising:
     a first clock circuit configured to generate a second clock signal in response to a first reset signal and a clock signal; and
     an adjustable delay circuit configured to receive a first supply voltage and a second supply voltage, and configured to adjust a delay between the second clock signal and a third clock signal in response to the second clock signal and an enable signal, the third clock signal being a delayed version of the second clock signal,
     wherein an amount of the delay between the second clock signal and the third clock signal is based on a voltage difference between the first supply voltage and the second supply voltage, the first supply voltage having a first swing, and the second supply voltage having a second swing.

2. The memory circuit of claim 1, wherein the adjustable delay circuit comprises:
   a first NAND logic gate configured to generate a first intermediate clock signal in response to the second clock signal and the enable signal, the first NAND logic gate comprising:
     a first NAND input terminal coupled to an output terminal of the first clock circuit, and configured to receive the second clock signal;
     a second NAND input terminal configured to receive the enable signal; and
     a first NAND output terminal configured to output the first intermediate clock signal.

3. The memory circuit of claim 2, wherein the adjustable delay circuit further comprises:
   a first delay circuit configured to generate a first delayed clock signal in response to the first intermediate clock signal, the first delayed clock signal being delayed with respect to the first intermediate clock signal.

4. The memory circuit of claim 3, wherein the adjustable delay circuit further comprises:
   a second delay circuit coupled to the first delay circuit, and being configured to generate the third clock signal in response to the first delayed clock signal,
   wherein the third clock signal is delayed and inverted with respect to the first delayed clock signal, and the second delay circuit comprises an odd number of inverters coupled together in series.

5. The memory circuit of claim 4, wherein the first delay circuit comprises:
   a first inverter coupled to a voltage supply of the first supply voltage, and being configured to generate a second intermediate clock signal in response to the first intermediate clock signal, the second intermediate clock signal being inverted from the first intermediate clock signal, the first inverter comprising:
     a first input terminal of the first inverter coupled to the first NAND output terminal, and configured to receive the first intermediate clock signal; and
     a first output terminal of the first inverter configured to output the second intermediate clock signal.

6. The memory circuit of claim 5, wherein the first delay circuit further comprises:
   a second inverter coupled to the voltage supply of the first supply voltage, and being configured to generate the first delayed clock signal in response to the second intermediate clock signal, the first delayed clock signal being inverted from the second intermediate clock signal, the second inverter comprising:
     a first input terminal of the second inverter coupled to the first output terminal of the first inverter, and configured to receive the second intermediate clock signal; and
     a first output terminal of the second inverter coupled to the second delay circuit, and being configured to output the first delayed clock signal.

7. The memory circuit of claim 6, wherein the first delay circuit further comprises:
   a first N-type transistor having a gate of the first N-type transistor coupled to a voltage supply of the second supply voltage, a drain of the first N-type transistor, and a source of the first N-type transistor coupled with the first output terminal of the first inverter and the first input terminal of the second inverter.

8. The memory circuit of claim 7, wherein the first delay circuit further comprises:
   a first P-type transistor having a gate of the first P-type transistor coupled to the first output terminal of the second inverter, and configured to receive the first delayed clock signal, a source of the first P-type transistor coupled to the voltage supply of the first supply voltage, and a drain of the first P-type transistor coupled with the drain of the first N-type transistor.

9. A memory circuit comprising:
   a memory cell array including a set of memory cells and a set of tracking cells;
   a word line driver circuit coupled to the memory cell array; and
   a control circuit coupled to the word line driver circuit, and configured to delay a leading edge or a falling edge of a word line signal in response to at least a first clock signal, the control circuit comprising:
     a first clock circuit configured to generate a second clock signal in response to a first reset signal and a clock signal; and
     an adjustable delay circuit configured to receive a first supply voltage and a second supply voltage, and configured to adjust a delay between the second clock signal and a third clock signal in response to the second clock signal and an enable signal, the third clock signal being a delayed version of the second clock signal,
     wherein an amount of the delay between the second clock signal and the third clock signal is based on a voltage difference between the first supply voltage and the second supply voltage, the first supply voltage having a first swing, and the second supply voltage having a second swing.

10. The memory circuit of claim 9, wherein the control circuit further comprises:
    a NOR logic gate coupled to the adjustable delay circuit and the first clock circuit, the NOR logic gate comprising:
      a first NOR input terminal coupled to an output terminal of the first clock circuit, and configured to receive the second clock signal;

a second NOR input terminal coupled to an output terminal of the adjustable delay circuit, and configured to receive the third clock signal; and a first NOR output terminal configured to output a fourth clock signal.

11. The memory circuit of claim 10, wherein the control circuit further comprises:

a first inverter configured to generate a fifth clock signal in response to the fourth clock signal, the fifth clock signal being inverted from the fourth clock signal, the first inverter comprising:

a first input terminal of the first inverter coupled to the first NOR output terminal, and configured to receive the fourth clock signal; and a first output terminal of the first inverter configured to output the fifth clock signal.

12. The memory circuit of claim 11, wherein the control circuit further comprises:

a second inverter configured to generate the first clock signal in response to the fifth clock signal, the first clock signal being inverted from the fifth clock signal, the second inverter comprising:

a first input terminal of the second inverter coupled to the first output terminal of the first inverter, and configured to receive the fifth clock signal; and a first output terminal of the second inverter configured to output the first clock signal.

13. The memory circuit of claim 12, wherein the control circuit further comprises:

a NAND logic gate configured to generate a first decoder signal in response to a second decoder signal and the first clock signal, the NAND logic gate comprising:

a first NAND input terminal coupled to the output terminal of the second inverter, and configured to receive the first clock signal;

a second NAND input terminal configured to receive the second decoder signal; and a first NAND output terminal configured to output the first decoder signal.

14. The memory circuit of claim 13, wherein the control circuit further comprises:

a third inverter configured to generate a third decoder signal in response to the first decoder signal, the first decoder signal being inverted from the third decoder signal, the third inverter comprising:

a first input terminal of the third inverter coupled to the first NAND output terminal, and configured to receive the first decoder signal; and a first output terminal of the third inverter configured to output the third decoder signal.

15. The memory circuit of claim 14, wherein the word line driver circuit comprises:

a word line post-decoder circuit coupled to the third inverter, and configured to generate a word line bar signal in response to the third decoder signal;

a fourth inverter coupled between the word line post-decoder circuit and a word line, and configured to generate the word line signal in response to the word line bar signal; and a first P-type transistor having a gate of the first P-type transistor coupled to a tracking word line, and configured to receive a tracking word line signal, a source of the first P-type transistor coupled to a voltage supply of the second supply voltage, and a drain of the first P-type transistor coupled with a tracking bit line, and configured to set a tracking bit line signal in response to the tracking word line signal.

16. The memory circuit of claim 15, wherein the set of tracking cells comprises:

a first N-type transistor having a gate of the first N-type transistor configured to receive a reference voltage of a reference voltage supply, a source of the first N-type transistor configured to receive the reference voltage of the reference voltage supply, and a drain of the first N-type transistor coupled with the tracking bit line;

a second N-type transistor having a gate of the second N-type transistor configured to receive the reference voltage of the reference voltage supply, a source of the second N-type transistor configured to receive the reference voltage of the reference voltage supply, and a drain of the second N-type transistor coupled with the tracking bit line;

a third N-type transistor having a gate of the third N-type transistor coupled to the tracking word line, and configured to receive the tracking word line signal, a source of the third N-type transistor configured to receive the reference voltage of the reference voltage supply, and a drain of the third N-type transistor coupled with the tracking bit line; and a fourth N-type transistor having a gate of the fourth N-type transistor coupled to the tracking word line, and configured to receive the tracking word line signal, a source of the fourth N-type transistor configured to receive the reference voltage of the reference voltage supply, and a drain of the fourth N-type transistor coupled with the tracking bit line.

17. The memory circuit of claim 16, wherein the control circuit further comprises:

a second P-type transistor having a gate of the second P-type transistor coupled to the tracking bit line, and configured to receive the tracking bit line signal, a source of the second P-type transistor coupled to a voltage supply of the first supply voltage, and a drain of the second P-type transistor;

a third P-type transistor having a gate of the third P-type transistor coupled to the tracking bit line and the gate of the second P-type transistor, and configured to receive the tracking bit line signal, a source of the third P-type transistor coupled to the drain of the second P-type transistor, and a drain of the third P-type transistor;

a fourth P-type transistor having a gate of the fourth P-type transistor, a source of the fourth P-type transistor coupled to the drain of the second P-type transistor and the source of the third P-type transistor, and a drain of the fourth P-type transistor coupled to the reference voltage supply; and a fifth N-type transistor having a gate of the fifth N-type transistor coupled to the gate of the second P-type transistor, the gate of the third P-type transistor and the tracking bit line, and configured to receive the tracking bit line signal, a source of the fifth N-type transistor coupled with the reference voltage supply, and a drain of the fifth N-type transistor coupled with the drain of the third P-type transistor and the gate of the fourth P-type transistor;

wherein the drain of the third P-type transistor and the drain of the fifth N-type transistor are configured to set a first signal; and the gate of the fourth P-type transistor being configured to receive the first signal.

18. The memory circuit of claim 17, wherein the control circuit further comprises:
a delay circuit coupled between
the first clock circuit, and
the drain of the third P-type transistor and the drain of the fifth N-type transistor,
the delay circuit being configured to delay the first signal thereby generating the first reset signal, the first reset signal being a delayed version of the first signal.

19. A method of operating a memory circuit, the method comprising:
generating, by a first clock circuit, a first clock signal in response to a first reset signal and a clock signal;
adjusting, by an adjustable delay circuit, a delay between the first clock signal and a second clock signal in response to the first clock signal and an enable signal, the second clock signal being a delayed version of the first clock signal, wherein an amount of the delay between the first clock signal and the second clock signal is based on a voltage difference between a first supply voltage and a second supply voltage, the first supply voltage having a first swing, and the second supply voltage having a second swing;
generating, by a first circuit, a third clock signal in response to the first clock signal and the second clock signal;
generating, by a first inverter, a fourth clock signal, in response to the third clock signal, the fourth clock signal being inverted from the third clock signal; and
generating, by a pair of inverters, a tracking word line signal in response to the fourth clock signal.

20. The method of claim 19, wherein adjusting the delay between the first clock signal and the second clock signal comprises:
generating, by a first NAND logic gate, a first intermediate clock signal in response to the first clock signal and the enable signal;
generating, by at least one of a first delay circuit or a second delay circuit, a first delayed clock signal in response to at least the first intermediate clock signal; and
generating, by a third delay circuit, the second clock signal in response to the first delayed clock signal,
wherein the second clock signal is delayed and inverted with respect to the first delayed clock signal.

* * * * *